US 011823896B2

(12) United States Patent
Khaderbad et al.

(10) Patent No.: US 11,823,896 B2
(45) Date of Patent: Nov. 21, 2023

(54) CONDUCTIVE STRUCTURE FORMED BY CYCLIC CHEMICAL VAPOR DEPOSITION

(71) Applicant: Taiwan Semiconductor Manufacturing Co., Ltd., Hsinchu (TW)

(72) Inventors: Mrunal A. Khaderbad, Hsinchu (TW); Keng-Chu Lin, Ping-Tung (TW); Shuen-Shin Liang, Hsinchu County (TW); Sung-Li Wang, Zhubei (TW); Yasutoshi Okuno, Hsinchu (TW); Yu-Yun Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 385 days.

(21) Appl. No.: 16/283,109

(22) Filed: Feb. 22, 2019

(65) Prior Publication Data

US 2020/0273695 A1 Aug. 27, 2020

(51) Int. Cl.
*H01L 21/02* (2006.01)
*H01L 21/768* (2006.01)

(52) U.S. Cl.
CPC .... *H01L 21/0228* (2013.01); *H01L 21/76816* (2013.01); *H01L 21/76879* (2013.01)

(58) Field of Classification Search
CPC ........... H01L 21/0228; H01L 21/76816; H01L 21/76879; H01L 21/28556; H01L 21/76877; H01L 21/53242; H01L 21/32051
See application file for complete search history.

(56) References Cited

U.S. PATENT DOCUMENTS

| 7,211,509 B1* | 5/2007 | Gopinath | C23C 16/0272 257/E21.17 |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2001/0019885 A1* | 9/2001 | Marsh | H01L 21/76843 438/654 |

(Continued)

*Primary Examiner* — Sophia T Nguyen
*Assistant Examiner* — Scott E Bauman
(74) *Attorney, Agent, or Firm* — Birch, Stewart, Kolasch & Birch, LLP

(57) ABSTRACT

A method for forming a semiconductor structure is provided. The method includes forming a dielectric structure on a semiconductor substrate, introducing a first gas on the dielectric structure to form first conductive structures on the dielectric structure, and introducing a second gas on the first conductive structures and the dielectric structure. The second gas is different from the first gas. The method also includes introducing a third gas on the first conductive structures and the dielectric structure to form second conductive structures on the dielectric structure. The first gas and the third gas include the same metal.

20 Claims, 20 Drawing Sheets

(56) References Cited

U.S. PATENT DOCUMENTS

| | | | |
|---|---|---|---|
| 2002/0167089 A1* | 11/2002 | Ahn | H01L 21/28556 |
| | | | 257/762 |
| 2004/0005753 A1* | 1/2004 | Kostamo | C23C 16/408 |
| | | | 438/222 |
| 2007/0148897 A1* | 6/2007 | Yeom | H10B 12/033 |
| | | | 438/386 |
| 2008/0124484 A1* | 5/2008 | Shinriki | C23C 16/0281 |
| | | | 427/535 |
| 2008/0150139 A1* | 6/2008 | Kim | H01L 21/76855 |
| | | | 257/E23.141 |
| 2014/0120722 A1* | 5/2014 | Richardson | H01L 21/76873 |
| | | | 438/675 |
| 2015/0240344 A1* | 8/2015 | Ishizaka | H01L 21/76843 |
| | | | 438/653 |
| 2017/0241014 A1* | 8/2017 | Yu | C23C 16/45557 |
| 2018/0053660 A1* | 2/2018 | Jandl | H01L 21/28568 |
| 2018/0347041 A1* | 12/2018 | Kim | H01L 21/76877 |
| 2019/0172947 A1* | 6/2019 | Hekmatshoartabari | H01L 21/02576 |
| 2019/0214296 A1* | 7/2019 | Wang | H01L 21/76879 |
| 2020/0118871 A1* | 4/2020 | Yu | H01L 21/76826 |

* cited by examiner

CONDUCTIVE STRUCTURE FORMED BY CYCLIC CHEMICAL VAPOR DEPOSITION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

Although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
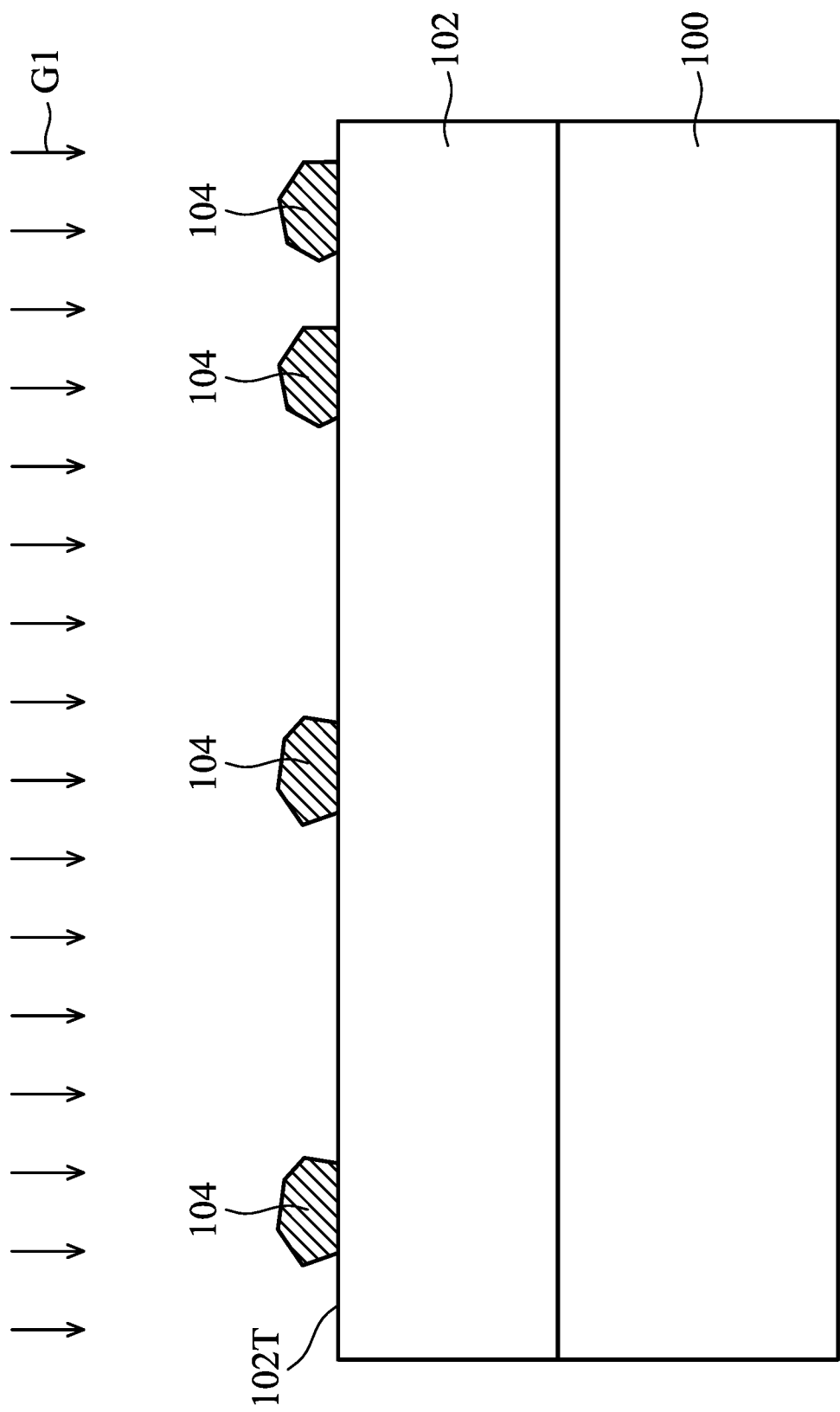
FIGS. 1A, 1B, 1C, 1D, and 1E are a series of cross-sectional views illustrating various stages of a method for forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of methods for forming semiconductor structures are provided. The method may include forming a conductive structure over a dielectric structure using multiple deposition processes and at least one modification process. The deposition process may include introducing a first gas on the dielectric structure to form a first conductive structure on the dielectric structure. The modification process may include introducing a second gas on the first conductive structure to modify the first conductive structure. The deposition process may be repeated and the modification process(es) may be performed between respective deposition processes, so that the resulting conductive structure on the dielectric structure may have fewer defects.

FIGS. 1A, 1B, 1C, 1D, and 1E are cross-sectional representations of various stages of a method for forming a semiconductor structure, in accordance with some embodiments of the present disclosure.

A semiconductor substrate 100 is provided, as shown in FIG. 1A in accordance with some embodiments. The semiconductor substrate 100 may be a semiconductor wafer such as a silicon wafer. The semiconductor substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the semiconductor substrate 100 includes an epitaxial layer. For example, the semiconductor substrate 100 may have an epitaxial layer overlying a bulk semiconductor. In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable process, or a combination thereof.

Various active elements (not shown) may be formed in and/or over the semiconductor substrate 100. Examples of the various active elements include transistors, diodes, another applicable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs). In some embodiments, the semiconductor substrate 100 includes a fin field effect transistor (FinFET). Various passive elements (not shown) may be formed in and/or over the semiconductor substrate 100. Examples of the various passive elements include capacitors, inductors, resistors, another applicable passive element, or a combination thereof. Various processes, such as front-end-of-line (FEOL) semiconductor fabrication processes, may be performed to form the various active elements and passive elements. The FEOL semiconductor fabrication processes may include deposition, etching, implantation, lithography, annealing, planarization, one or more other applicable processes, or a combination thereof.

In some embodiments, isolation features (not shown) are formed in the semiconductor substrate 100. The isolation features may be used to define active regions and electrically isolate various elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

Afterwards, a dielectric structure 102 is formed over the semiconductor substrate 100, as shown in FIG. 1A in accordance with some embodiments. The dielectric structure 102 may be a gate dielectric layer, an interlayer dielectric layer, a spacer (e.g., a gate sidewall spacer), another applicable dielectric structure, or a combination thereof.

In some embodiments, the dielectric structure 102 is made of silicon oxide, silicon nitride, silicon oxynitride, silicon carbide, another applicable dielectric material, or a combination thereof.

In some embodiments, the dielectric structure 102 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the dielectric structure 102 is made of tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof.

The dielectric structure 102 may be formed using a chemical vapor deposition (CVD) process (e.g., a high-density plasma chemical vapor deposition (HDPCVD) process, an atmospheric pressure chemical vapor deposition (APCVD) process, a low-pressure chemical vapor deposition (LPCVD) process, and a plasma enhanced chemical vapor deposition (PECVD) process), a spin-on coating process, an atomic layer deposition process, another applicable process, or a combination thereof.

Afterwards, first conductive structures 104 are formed on a top surface 102T of the dielectric structure 102, as shown in FIG. 1A in accordance with some embodiments. The first conductive structures 104 may be in direct contact with the top surface 102T of the dielectric structure 102. In some embodiments, the top surface 102T of the dielectric structure 102 is exposed between the first conductive structures 104, as shown in FIG. 1A.

In some embodiments, the first conductive structures are made of a metal, and the metal is ruthenium (Ru), iridium (Ir), rhodium (Rh), molybdenum (Mo), nickel (Ni), or platinum (Pt).

In some embodiments, the first conductive structures 104 are nuclei of a metal (e.g., Ru, Ir, Rh, Mo, Ni, or Pt), and the top surface 102T of the dielectric structure 102 includes functional groups (e.g., hydroxyl group) to serve as nucleation sites for forming the first conductive structures 104. In some embodiments, the dielectric structure 102 includes hydroxyl group on a material such as $SiO_2$, $TiO_2$, $Al_2O_3$, $HfO_2$, $Hf_xZr_yO_2$, MgO, $La_xO_y$, or $ZrO_2$. In some embodiments, the top surface 102T is a surface of a material such as SiNH, oxides (e.g., $TiO_2$, and $ZrO_2$), graphene, or moly sulfide.

In some embodiments, the first conductive structures 104 are formed on the top surface 102T of the dielectric structure 102 using a chemical vapor deposition process. In some embodiments, the chemical vapor deposition process for forming the first conductive structures 104 includes introducing a gas G1 on the top surface 102T of the dielectric structure 102, as shown in FIG. 1A. In some embodiments, the gas G1 includes the metal of the first conductive structures 104. In some embodiments, the gas G1 includes a precursor containing the metal of the first conductive structures 104. In some embodiments, the metal in the precursor in the gas G1 is deposited on the top surface 102T of the dielectric structure 102 by a chemical vapor deposition to form the first conductive structures 104.

In some embodiments, the first conductive structures 104 are made of Ru, and the precursor in the gas G1 includes Ru containing compounds, such as $Ru_3(CO)_{12}$, $Ru(CO)_5$, $C_{10}H_{10}Ru$, $Ru(CO)_3C_6H_8$, $Ru(CO)_2(tmhd)_2$, $Ru(CO)_2(acac)_2$, $Ru(C_6H_6)(C_6H_8)$, $Ru(acac)_3$, $RuO_4$, $Ru(EtCp)_2$, RuCpPy, Ru Carbonyl diketone derivatives, Ru cyclopentadienyl derivatives, or a combination thereof.

In some embodiments, the first conductive structures 104 are made of Ir, and the precursor in the gas G1 includes Ir containing compounds, such as $IrF_6$, $Ir(CH_3COCHCO-CH3)_3$, or a combination thereof. In some embodiments, the first conductive structures 104 are made of Rh, and the precursor in the gas G1 includes Rh containing compounds, such as $Rh(CH_3COCHCOCH_3)_3$, $Rh(CO)_4$, $Rh(C_5H_4F_3O_2)_3$, or a combination thereof. In some embodiments, the first conductive structures 104 are made of Mo, and the precursor in the gas G1 includes Mo containing compounds, such as $MoCl_6$, $MoF_6$, $Mo(CO)_6$, or a combination thereof. In some embodiments, the first conductive structures 104 are made of Ni, and the precursor in the gas G1 includes Ni containing compounds, such as $Ni(CO)_4$, $Ni(C_5H_5)_2$, $Ni(C_5HF_6O_2)_2$, or a combination thereof. In some embodiments, the first conductive structures 104 are made of Pt, and the precursor in the gas G1 includes Pt containing compounds, such as $Pt(CO)_2Cl_2$.

The chemical vapor deposition process for forming the first conductive structures 104 may be performed in a deposition chamber. In some embodiments, the semiconductor substrate 100 and the dielectric structure 102 are transferred into a deposition chamber, and then the gas G1 is introduced into the deposition chamber to form the first conductive structures 104 by a chemical vapor deposition.

In some embodiments, during the chemical vapor deposition process for forming the first conductive structures 104, the gas G1 is introduced into the deposition chamber at a flow rate in a range from about 0.1 sccm to about 1000 sccm. In some embodiments, during the chemical vapor deposition process for forming the first conductive structures 104, the gas G1 is introduced into the deposition chamber at a flow rate in a range from about 10 sccm to about 500 sccm. The flow rate of the gas G1 may be adjusted so that the resulting first conductive structures 104 may have improved uniformity.

In some embodiments, during the chemical vapor deposition process for forming the first conductive structures 104, the gas G1 is introduced into the deposition chamber for a duration in a range from about 5 seconds to about 5000 seconds. In some embodiments, during the chemical vapor deposition process for forming the first conductive structures 104, the gas G1 is introduced into the deposition chamber for a duration in a range from about 1 second to about 60 seconds. When the duration is too long, it is likely that top portions of adjacent first conductive structures 104 are connected while bottom portions of adjacent first conductive structures 104 remain unconnected, which may result in disadvantageous voids or seams between adjacent first conductive structures 104. When the duration is too short, it may be difficult to control the deposition behavior of the first conductive structures 104.

In some embodiments, during the chemical vapor deposition process for forming the first conductive structures 104, the pressure inside the deposition chamber is in a range from about 0.0001 torr to about 2 torr. In some embodiments, during the chemical vapor deposition process for forming the first conductive structures 104, the pressure inside the deposition chamber is in a range from about 0.0001 torr to about 0.01 torr. The pressure inside the deposition chamber during the chemical vapor deposition process for forming the first conductive structures 104 may be adjusted so that the uniformity of the first conductive structures 104 may be improved.

In some embodiments, the metal included in the gas G1 for forming the first conductive structures 104 is deposited on the top surface 102T of the dielectric structure 102 at a deposition temperature in a range from about 120° C. to about 170° C. The deposition temperature may be adjusted so that defects in the first conductive structures 104 may be reduced. The deposition temperature may be defined as the temperature of the dielectric structure 102 (e.g., the temperature of a surface of the dielectric structure 102) or the temperature of the semiconductor substrate 100 (e.g., the temperature of a surface of the semiconductor substrate 100) measured in the deposition chamber by a thermometer (e.g. a thermocouple) during the chemical vapor deposition process for forming the first conductive structures 104. For example, the semiconductor substrate 100 and the dielectric structure 102 may be placed on a holder in the deposition chamber, and the holder may include a heater which may be used to heat the semiconductor substrate 100 and the dielectric structure 102 to a desired deposition temperature.

Figure 1B:
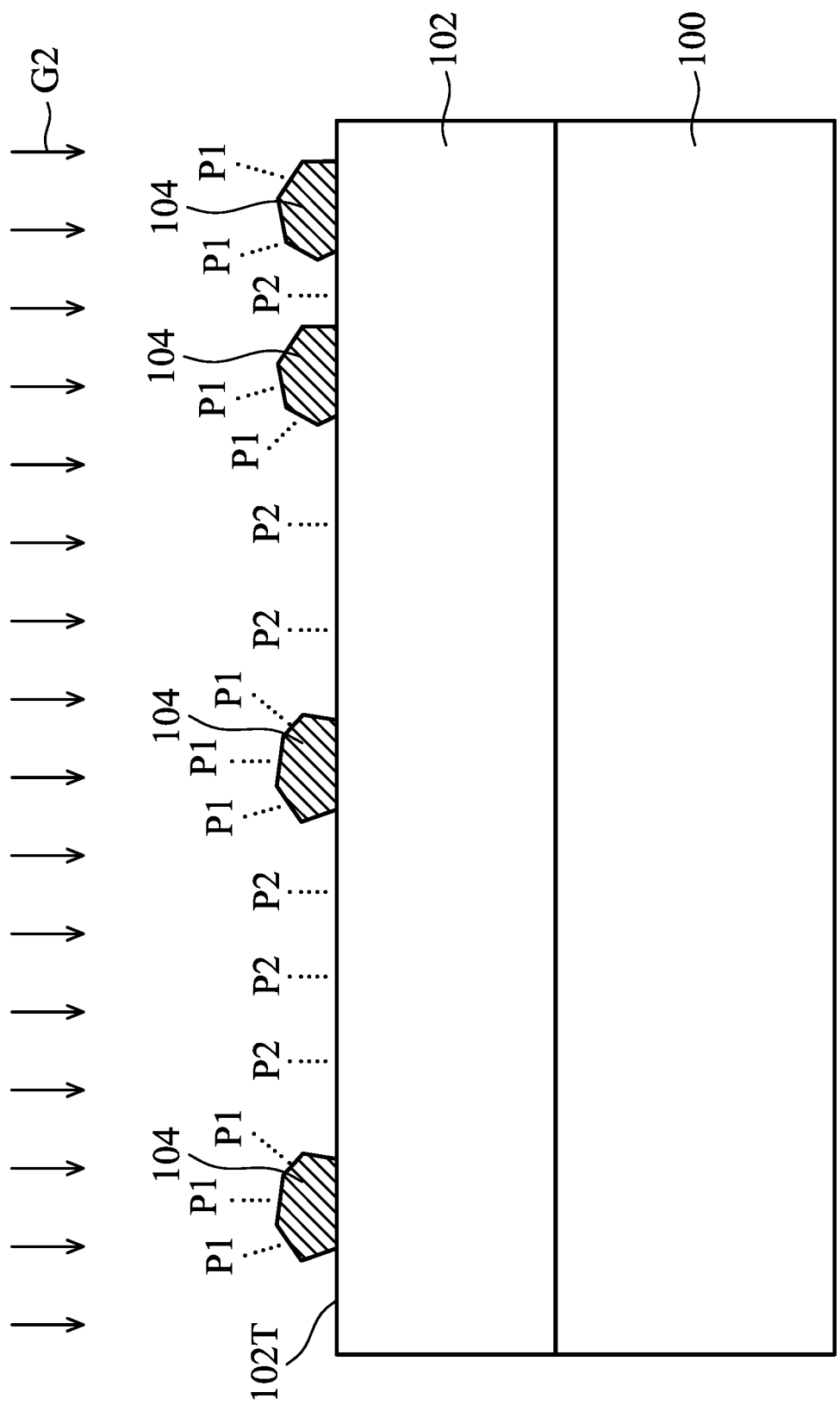

Afterwards, a modification process is performed to modify surface properties of the first conductive structures 104, in accordance with some embodiments. In some embodiments, the modification process includes introducing gas G2 on surfaces of the first conductive structures 104 and the exposed top surface 102T of the dielectric structure 102 to modify the surface properties of the first conductive structures 104, as shown in FIG. 1B. The introduction of the gas G2 in the modification process may also modify a surface property of the exposed top surface 102T of the dielectric structure 102.

The gas G2 used in the modification process may passivate the surfaces of the first conductive structures 104 so that it becomes more difficult to form conductive structures (e.g., the second conductive structures 106 which will be discussed in the following paragraphs) on the surfaces of the first conductive structures 104. For example, CO, $NH_3$, $O_2$, $N_2O$, NO, $H_2$, $N_2$, or a combination thereof may be included in the gas G2 to passivate the surfaces of the first conductive structures 104.

In some embodiments, the gas G2 also passivates the exposed top surface 102T of the dielectric structure 102, but the passivating effect on the surfaces of the first conductive structures 104 is greater than the passivating effect on the exposed top surface 102T of the dielectric structure 102. In some embodiments, due to the modification process, forming conductive structures on the surfaces of the first conductive structures 104 is more difficult than forming conductive structures on the exposed top surface 102T of the dielectric structure 102.

In some embodiments, a portion P1 of the gas G2 is absorbed on the surface of the first conductive structure 104, and a portion P2 of the gas G2 is absorbed on the exposed top surface 102T of the dielectric structure 102, as shown in FIG. 1B. The bonding strength between the first conductive structure 104 and the portion P1 of the gas G2 may be higher than the bonding strength between the dielectric structure 102 and the portion P2 of the gas G2. Therefore, the minimum energy to remove the portion P1 of the gas G2 from the surface of the first conductive structure 104 may be greater than the minimum energy to remove the portion P2 of the gas G2 from the top surface 102T of the dielectric structure 102. For example, the portion P1 of the gas G2 may be chemically absorbed on the surface of the first conductive structure 104, while the portion P2 of the gas G2 may be physically absorbed on the top surface 102T of the dielectric structure 102. For example, the portion P1 of the gas G2 may bind to the surface of the first conductive structure 104 through a chemical bond, while the portion P2 of the gas G2 may bind to the top surface 102T of the dielectric structure 102 through a physical bond.

In some embodiments, since the bonding strength between the first conductive structure 104 and the portion P1 of the gas G2 is greater than the bonding strength between the dielectric structure 102 and the portion P2 of the gas G2, the passivating effect of the gas G2 on the surface of the first conductive structure 104 is greater than the passivating effect of the gas G2 on the top surface 102T of the dielectric structure 102 exposed between the first conductive structures 104.

In some embodiments, the gas G2 is free of the metal included in the gas G1 (i.e., the metal used to form the first conductive structures 104). For example, the gas G2 may not include Ru, Ir, Rh, Mo, Ni, Pt, or a combination thereof. In some embodiments, since the gas G2 does not include the metal the same as the metal of the first conductive structures 104, no conductive structure made of the metal the same as the metal of the first conductive structures 104 is formed on the first conductive structures 104 and the dielectric structure 102 during the introduction of the gas G2.

The gas G1 and the gas G2 may be introduced into the same deposition chamber. In some embodiments, after the formation of the first conductive structures 104, the gas G2 is introduced into the deposition chamber where the chemical vapor deposition for forming the first conductive structures 104 is performed.

In some embodiments, the gas G2 is introduced into the deposition chamber at a flow rate in a range from about 50 sccm to about 10000 sccm. In some embodiments, the gas G2 is introduced into the deposition chamber at a flow rate in a range from about 50 sccm to about 5000 sccm. When the flow rate of the gas G2 is too low, the surfaces of the first conductive structures 104 may not be efficiently passivated. When the flow rate of the gas G2 is too high, the manufacturing cost may be increased.

In some embodiments, the gas G2 is introduced into the deposition chamber for a duration in a range from about 5 seconds to about 300 seconds. When the duration is too short, the surfaces of the first conductive structures 104 may not be sufficiently passivated. When the duration of is too long, the manufacturing cost may be increased.

In some embodiments, during the introduction of the gas G2 into the deposition chamber, the pressure inside the deposition chamber is in a range from about 0.0001 torr to about 0.01 torr. In some embodiments, during the introduction of the gas G2 into the deposition chamber, the pressure inside the deposition chamber is in a range from about 0.0001 torr to about 5 torr. When the pressure inside the deposition chamber during the introduction of the gas G2 into the deposition chamber is too low or too high, it is difficult to control the passivating effect of the gas G2 on the surfaces of the first conductive structures 104.

Figure 1C:
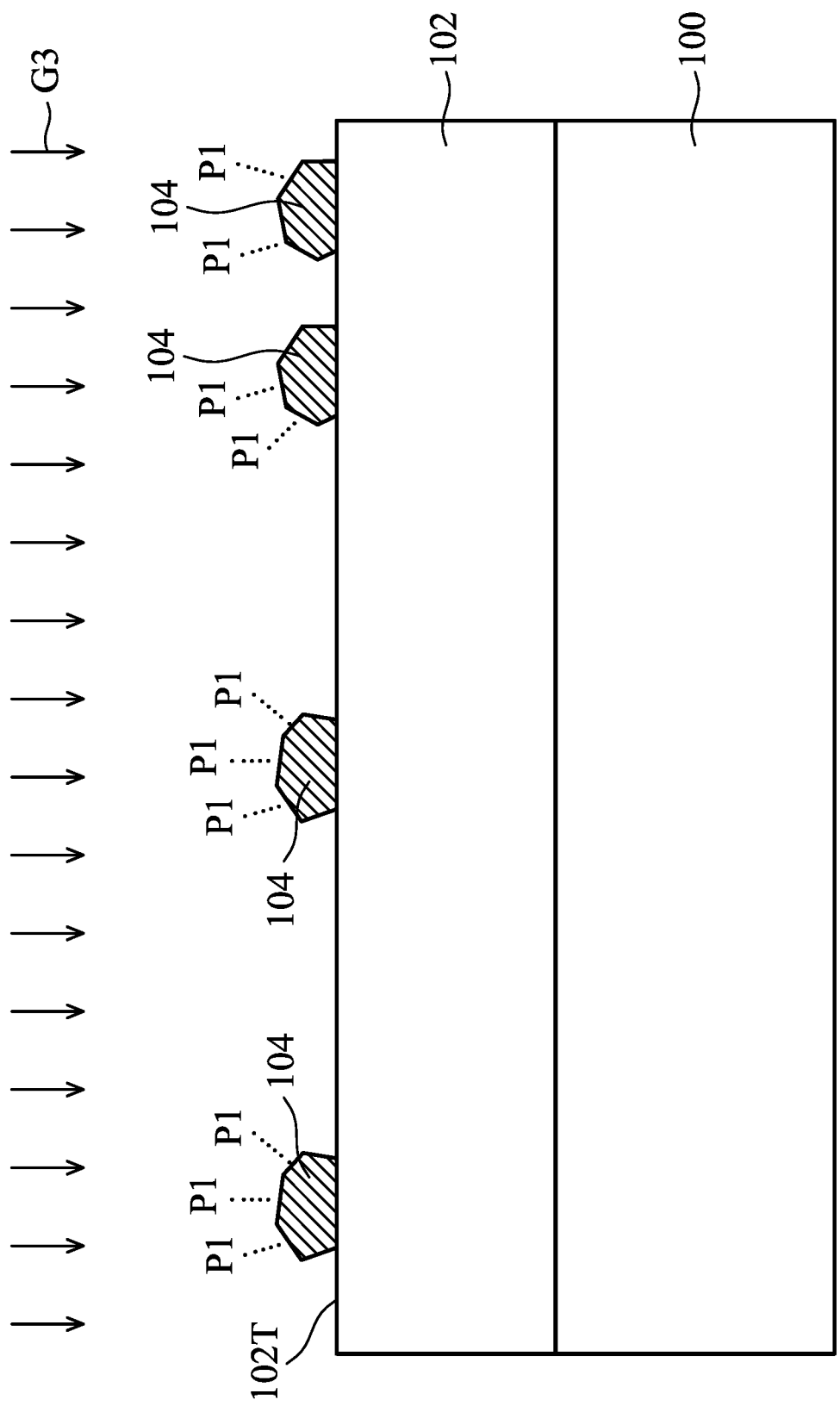

Afterwards, purging gas G3 may be optionally introduced on the surfaces of the first conductive structures 104 and the top surface 102T of the dielectric structure 102, as shown in FIG. 1C in accordance with some embodiments. The purging gas G3 may be used to purge the top surface 102T of the dielectric structure 102 and/or the surfaces of the first conductive structures 104. In some embodiments, the purging gas G3 includes $N_2$, Ar, He, or a combination thereof.

In some embodiments, the portion P2 of the gas G2 is removed from the top surface 102T of the dielectric structure 102 by purging the top surface 102T of the dielectric structure 102 with the purging gas G3, as shown in FIG. 1C. In some embodiments, since the bonding strength between the first conductive structure 104 and the portion P1 of the gas G2 is higher than the bonding strength between the dielectric structure 102 and the portion P2 of the gas G2, removing the portion P2 of the gas G2 from the dielectric structure 102 by the purging gas G3 is easier than removing the portion P1 of the gas G2 from the first conductive structure 104 by the purging gas G3. In some embodiments, the portion P2 of the gas G2 is removed from the top surface 102T of the dielectric structure 102 by the purging gas G3 while the portion P1 of the gas G2 is still left on the surfaces of the first conductive structures 104. In some embodiments, since the portion P2 of the gas G2 is removed from the top surface 102T of the dielectric structure 102 by the purging gas G3, the passivating effect of the gas G2 on the top surface 102T is decreased. In some embodiments, since the top surface 102T of the dielectric structure 102 and the surfaces of the first conductive structures 104 are purged by the purging gas G3, the passivating effect of the gas G2 on the top surface 102T of the dielectric structure 102 becomes further lower than the passivating effect of the gas G2 on the surfaces of the first conductive structures 104.

The purging gas G3, the gas G2 and the gas G1 may be introduced into the same deposition chamber. In some embodiments, the purging gas G3 is introduced into the deposition chamber at a flow rate in a range from about 10 sccm to about 1000 sccm for a duration in a range from about 5 seconds to about 300 seconds, and the pressure inside the deposition chamber during the introduction of the purging gas G3 into the deposition chamber is in a range from about 0.0001 torr to about 0.01 torr. The flow rate of the purging gas G3, the duration of the introduction of the purging gas G3 into the deposition chamber, and/or the pressure inside the deposition chamber during the introduction of the purging gas G3 may be adjusted so that the passivating effects of the gas G2 on the first conductive structures 104 and on the dielectric structure 102 may be effectively tuned.

Figure 1D:
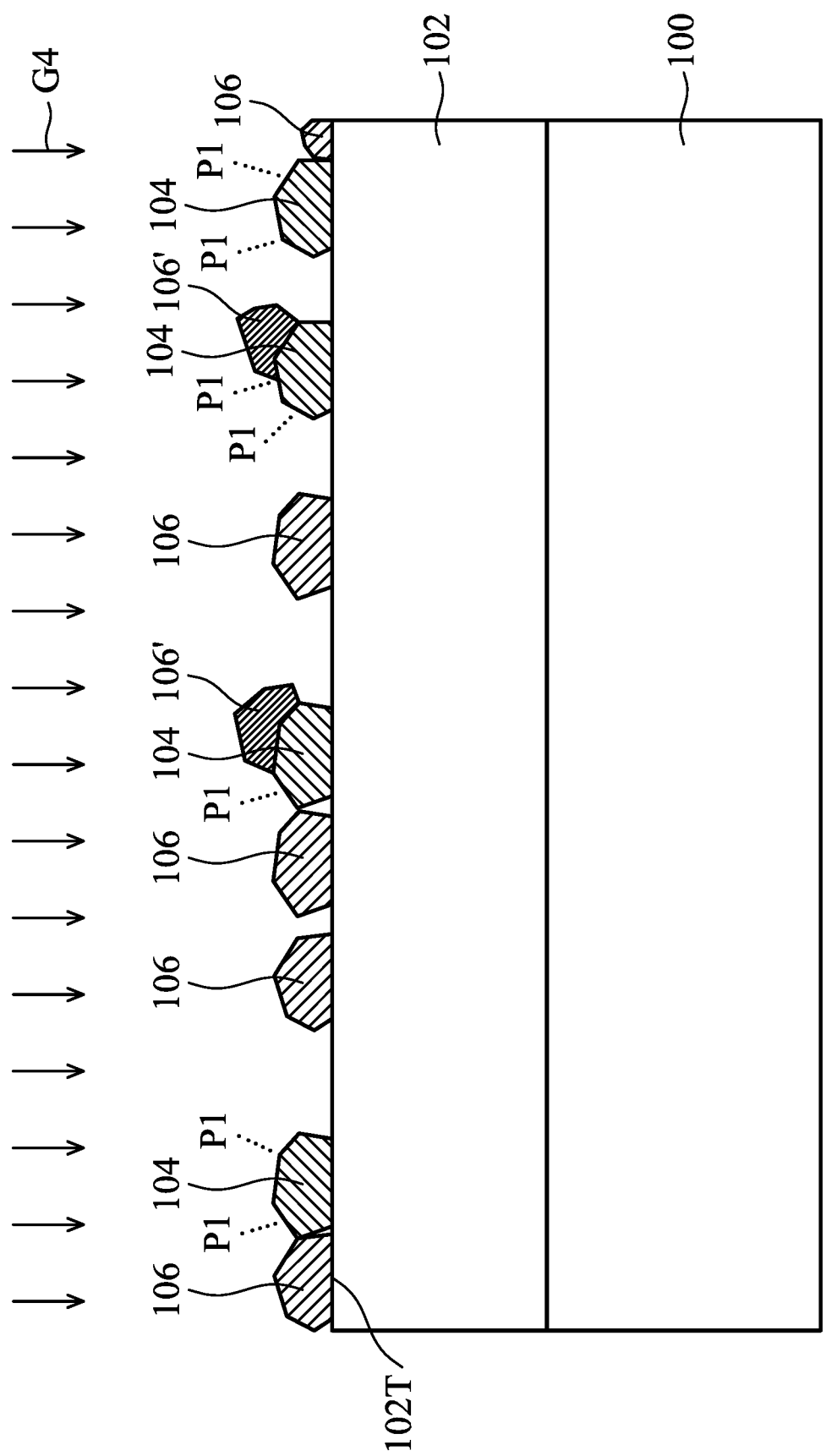

Afterwards, second conductive structures 106 are formed on the top surface 102T of the dielectric structure 102 exposed between first conductive structures 104, as shown in FIG. 1D in accordance with some embodiments. The second conductive structures 106 may be in direct contact with the top surface 102T of the dielectric structure 102. The second conductive structures 106 may be formed between two adjacent first conductive structures 104. In some embodiments, the first conductive structures 104 and the second conductive structures 106 are configured to form at least a portion of a conductive structure (e.g., a source/drain contact structure, a conductive via structure, or a gate electrode layer), and the details will be discussed in the following paragraphs.

In some embodiments, since the passivating effect of the gas G2 on the surfaces of the first conductive structures 104 is greater than the passivating effect of the gas G2 on the exposed top surface 102T of the dielectric structure 102, conductive structures (e.g., the second conductive structures 106) tend to form directly on the exposed top surface 102T of the dielectric structure 102 rather than form directly on the surfaces of the first conductive structures 104. Therefore, in these embodiments, a conductive structure (e.g., a source/drain contact structure, a conductive via structure, or a gate electrode layer) made of the first conductive structures 104 and the second conductive structures 106 can have fewer defects (e.g., voids or seams which are formed due to the fact that the conductive structures formed on the first conductive structures 104 connect to each other and hinder conductive structures from forming on the exposed top surface 102T of the dielectric structure 102).

In some embodiments, the second conductive structures 106 and the first conductive structures 104 are made of the same metal. For example, the second conductive structures 106 may be made of Ru, Ir, Rh, Mo, Ni, or Pt. For example, the second conductive structures 106 may be nuclei of Ru, Ir, Rh, Mo, Ni, or Pt.

In some embodiments, the second conductive structures 106 are formed on the exposed top surface 102T of the dielectric structure 102 using a chemical vapor deposition process. In some embodiments, the chemical vapor deposition process for forming the second conductive structures 106 includes introducing a gas G4 on the top surface 102T of the dielectric structure 102, as shown in FIG. 1D. In some embodiments, the gas G4 includes the metal of the second conductive structures 106. In some embodiments, the gas G4 includes a precursor containing the metal of the second conductive structures 106. In some embodiments, the metal in the precursor in the gas G4 is deposited on the exposed top surface 102T of the dielectric structure 102 by a chemical vapor deposition to form the second conductive structures 106.

In some embodiments, the precursor in the gas G4 and the precursor in the gas G1 include the same metal, so that the first conductive structures 104 and the second conductive structures 106 include the same metal. In some embodiments, the gas G4 and the gas G1 include the same precursor (e.g., $Ru_3(CO)_{12}$). In some embodiments, the composition of the gas G4 and the gas G1 are the same.

In some embodiments, the second conductive structures 106 are made of Ru, and the precursor in the gas G4 includes Ru containing compounds, such as $Ru_3(CO)_{12}$, $Ru(CO)_5$, $C_{10}H_{10}Ru$, $Ru(CO)_3C_6H_8$, $Ru(CO)_2(tmhd)_2$, $Ru(CO)_2(acac)_2$, $Ru(C_6H_6)(C_6H_8)$, $Ru(acac)_3$, $RuO_4$, $Ru(EtCp)_2$, RuCpPy, Ru Carbonyl diketone derivatives, Ru cyclopentadienyl derivatives, or a combination thereof.

In some embodiments, the second conductive structures 106 are made of Ir, and the precursor in the gas G4 includes Ir containing compounds, such as $IrF_6$, $Ir(CH_3COCHCOCH3)_3$, or a combination thereof. In some embodiments, the second conductive structures 106 are made of Rh, and the precursor in the gas G4 includes Rh containing compounds, such as $Rh(CH_3COCHCOCH_3)_3$, $Rh(CO)_4$, $Rh(C_5H_4F_3O_2)_3$, or a combination thereof. In some embodiments, the second conductive structures 106 are made of Mo, and the precursor in the gas G4 includes Mo containing compounds, such as $MoCl_6$, $MoF_6$, $Mo(CO)_6$, or a combination thereof. In some embodiments, the second conductive structures 106 are made of Ni, and the precursor in the gas G4 includes Ni containing compounds, such as $Ni(CO)_4$, $Ni(C_5H_5)_2$, $Ni(C_5HF_6O_2)_2$, or a combination thereof. In some embodiments, the second conductive structures 106 are made of Pt, and the precursor in the gas G4 includes Pt containing compounds, such as $Pt(CO)_2Cl_2$.

The chemical vapor deposition process for forming the second conductive structures 106 may be performed in a deposition chamber. In some embodiments, the gas G1 and the gas G4 are introduced into the same deposition chamber, and the chemical vapor deposition for forming the first conductive structures 104 and the chemical vapor deposition for forming the second conductive structures 106 are performed in the same deposition chamber. In some embodiments, the chemical vapor deposition for forming the first conductive structures 104 and the chemical vapor deposition for forming the second conductive structures 106 are performed in-situ in the same deposition chamber.

In some embodiments, during the chemical vapor deposition process for forming the second conductive structures 106, the gas G4 is introduced into the deposition chamber at a flow rate in a range from about 10 sccm to about 5000 sccm. The flow rate of the gas G4 may be adjusted so that the second conductive structures 106 may have improved uniformity.

In some embodiments, during the chemical vapor deposition process for forming the second conductive structures 106, the gas G4 is introduced into the deposition chamber for a duration in a range from about 5 seconds to about 300 seconds. When the duration is too long, it is likely that top portions of adjacent second conductive structures 106 are connected while bottom portions of adjacent second conductive structures 106 remain unconnected, which may result in disadvantageous voids between adjacent second conductive structures 106. When the duration is too short, it may be hard to control the deposition behavior of the second conductive structures 106.

In some embodiments, during the chemical vapor deposition process for forming the second conductive structures 106, the pressure inside the deposition chamber is in a range from about 0.0001 torr to about 0.01 torr. The pressure inside the deposition chamber during the chemical vapor deposition process for forming the second conductive structures 106 may be adjusted so that the uniformity of the second conductive structures 106 may be improved.

In some embodiments, the metal in the gas G4 for forming the second conductive structures 106 is deposited on the exposed top surface 102T of the dielectric structure 102 at a deposition temperature in a range from about 100° C. to about 400° C. The deposition temperature may be adjusted so that defects in the second conductive structures 106 may be reduced.

In some embodiments, during the chemical vapor deposition for forming the second conductive structures 106, some conductive structures 106' may also be formed on the tops of the first conductive structures 104, as shown in FIG. 1D. The conductive structure 106' may be in direct contact with the first conductive structure 104 but not in direct contact with the dielectric structure 102. The conductive structure 106' and the second conductive structures 106 may be made of the same metal. In some embodiments, since the passivating effect of the gas G2 on the surfaces of the first conductive structures 104 is greater than the passivating effect of the gas G2 on the top surface 102T of the dielectric structure 102, the amount and/or the deposition rate of the second conductive structure 106 is greater than those of the conductive structure 106', reducing the defects (e.g., voids or seams) formed in a conductive structure (e.g., a source/drain contact structure, a conductive via structure, or a gate electrode layer) made of the first conductive structures 104, the second conductive structures 106 and the conductive structures 106'.

Figure 1E:
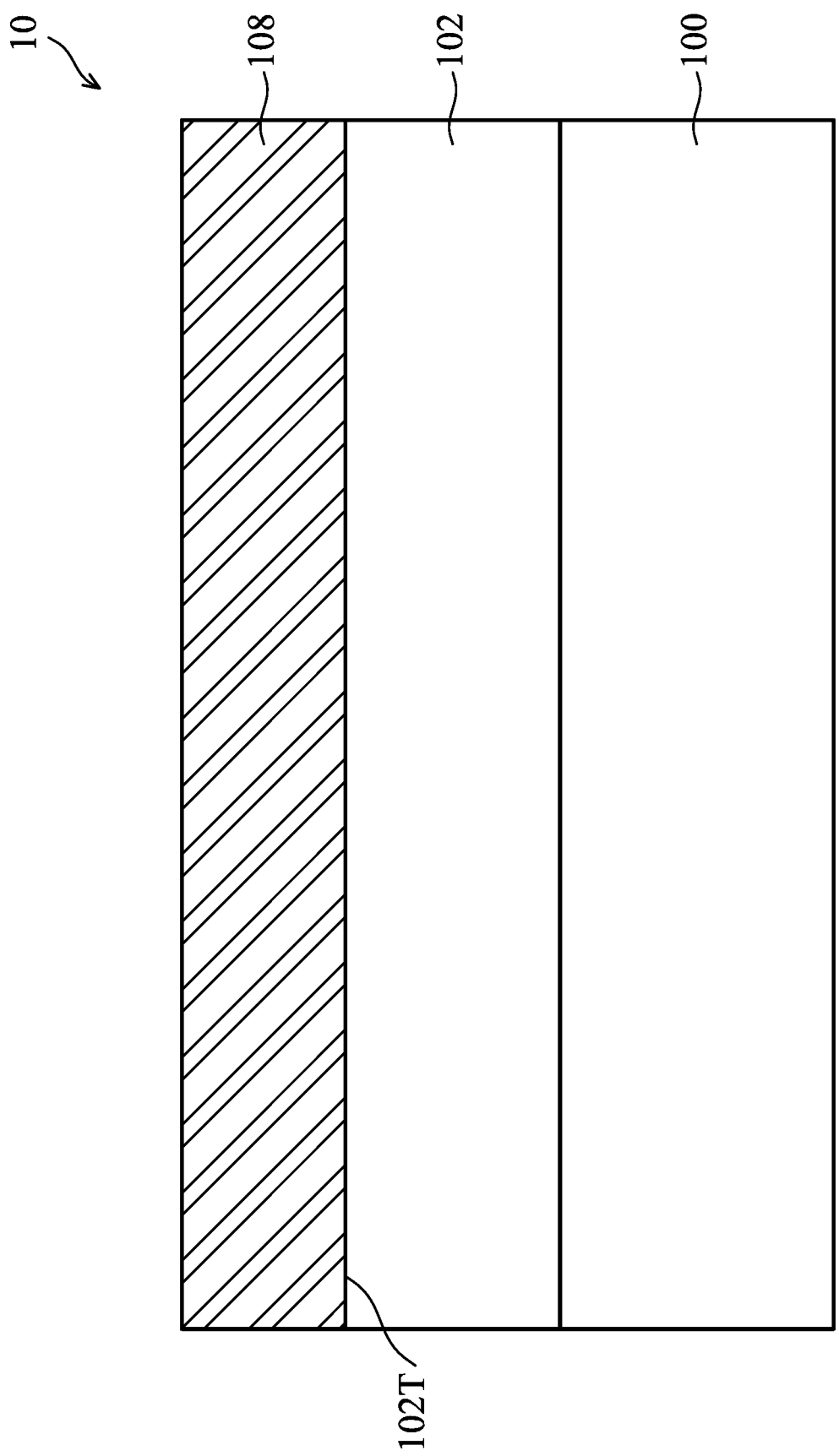

Afterwards, a conductive structure 108 is formed on the top surface 102T of the dielectric structure 102 so as to form a semiconductor structure 10, as shown in FIG. 1E in accordance with some embodiments. A chemical vapor deposition process for forming conductive structures (e.g., the conductive structures 104, 106 and 106') followed by a modification process to passivate the surfaces of the conductive structures may be referred to as a deposition-modification cycle. In some embodiments, the conductive structure 108 is formed by repeating the deposition-modification cycle, and the conductive structure 108 is made of the conductive structures formed by each deposition-modification cycle. These deposition-modification cycles for forming the conductive structure 108 may be performed in-situ in the same deposition chamber. For example, the conductive structure 108 may be a source/drain contact structure, a conductive via structure, or a gate electrode layer.

For example, the chemical vapor deposition process including the introduction of the gas G1 combined with the modification process including the introduction of the gas G2 may be referred to as the first deposition-modification cycle for forming the conductive structure 108, and the chemical vapor deposition process including the introduction of the gas G4 into the deposition chamber may be referred to as the chemical vapor deposition process of the second deposition-modification cycle next to the first deposition-modification cycle. The introduction of the gas G4 may be referred to as a repeat of the introduction of the gas G1.

In some embodiments, a deposition-modification cycle may further include a purging process (e.g., the purging process which includes introducing the purging gas G3 into the deposition chamber). In a deposition-modification cycle, the purging process may be performed after the modification process. In some embodiments, a deposition-modification cycle may further include a vacuum process to remove by-products from the deposition chamber.

In some embodiments, since the conductive structure 108 is formed by repeating the deposition-modification cycle, the conductive structure 108 has fewer defects and lower resistance, improving the performance of the semiconductor structure 10.

In some embodiments, the conductive structure 108 is formed by performing the deposition-modification cycle (e.g., a deposition-modification cycle which includes the introduction of the gas G1 followed by the introduction of the gas G2) between 10 and 60 times. The number of times that the deposition-modification cycle is performed may be adjusted so that the resistance of the conductive structure 108 is lower due, for example, to fewer defects (e.g., voids or seams) being formed in the conductive structure 108.

In some embodiments, the conductive structure 108 formed by repeating the deposition-modification cycle is smooth and has fewer defects, and thus the adhesion between the dielectric structure 102 and the conductive structure 108 is good and no additional adhesion layer between the dielectric structure 102 and the conductive structure 108 is needed.

In some embodiments, by repeating the deposition-modification cycle, a metal (e.g., Ru, Ir, Rh, Mo, Ni, or Pt) whose diffusivity in the dielectric structure 102 is low can be used to form the conducive structure 108 on the dielectric structure 102 without increasing defects (e.g., voids or seams) in the conductive structure 108, and thus no additional diffusion barrier layer between the dielectric structure 102 and the conductive structure 108 is needed.

In some embodiments, by repeating the deposition-modification cycle, a metal (e.g., Ru, Ir, Rh, Mo, Ni, or Pt) whose mean free path is low can be used to form the conducive structure 108 without increasing defects (e.g., voids or seams) in the conductive structure 108, and thus the conductive structure 108 has lower resistance.

FIGS. 2A, 2B, 2C, 2D, 2E, 2F, and 2G are cross-sectional representations of various stages of a method for forming a semiconductor structure, in accordance with some embodiments of the present disclosure. It should be noted that unless otherwise specified, in the embodiments illustrated in FIGS. 2A to 2G, the elements the same as or similar to those discussed in the above embodiments will be denoted by the same reference numerals, and the materials and forming methods (e.g., the processes and the parameters) thereof may also be the same as or similar to those discussed in the above embodiments.

Figure 2A:
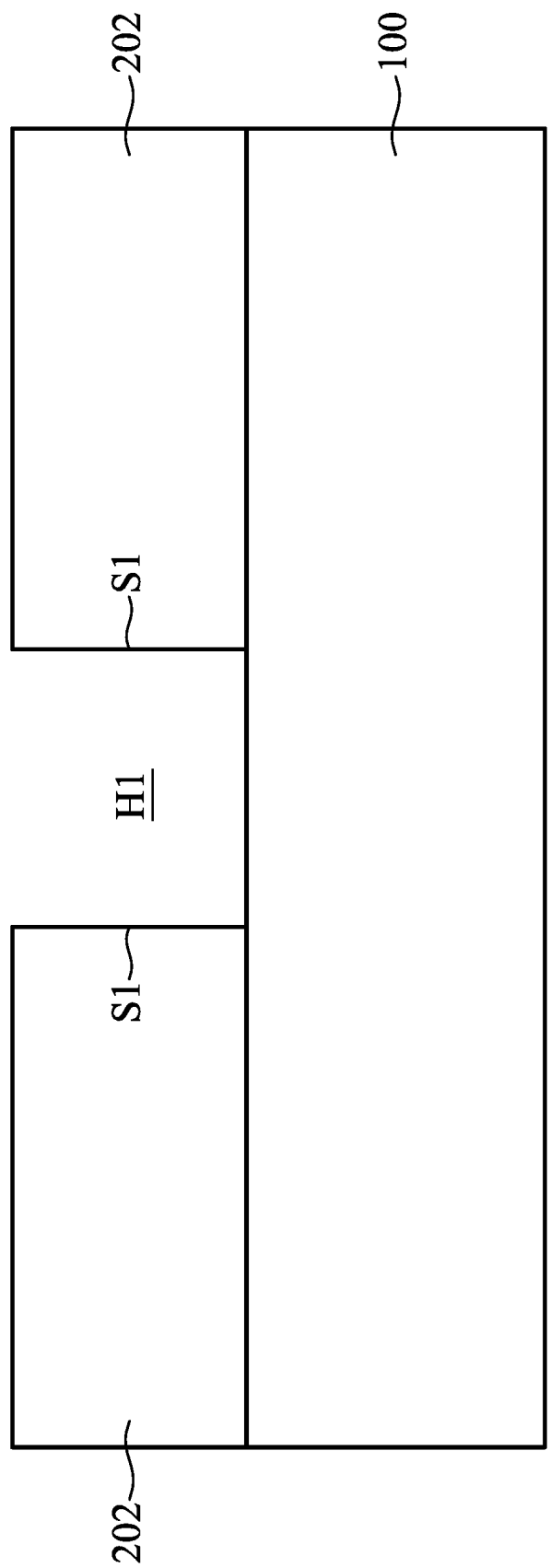
FIGS. 2A, 2B, 2C, 2D, 2E, 2F, and 2G are a series of cross-sectional views illustrating various stages of a method for forming a semiconductor structure in accordance with some embodiments.

A dielectric layer 202 is formed on the semiconductor substrate 100, as shown in FIG. 2A in accordance with some embodiments. The dielectric layer 202 may be the same as or similar to the dielectric structure 102 of the above embodiments, and thus the materials and methods for forming the dielectric layer 202 may be the same as or similar to those of the dielectric structure 102. In the interests of simplicity, the details will not be discussed again.

Afterwards, a trench (or opening) H1 is formed in the dielectric layer 202, as shown in FIG. 2A in accordance with some embodiments. The trench H1 may be defined by sidewall surfaces S1 of the dielectric layer 202. The sidewall surfaces S1 may be also referred to as sidewall surfaces of the trench H1. In some embodiments, a lithography process and an etching process are performed to remove a portion of the dielectric layer 202 to form the trench H1 in the dielectric layer 202. The lithography process may include photoresist coating (e.g., spin-on coating), soft baking, mask aligning, exposure, post-exposure baking, developing the photoresist, rinsing and drying (e.g., hard baking). The etching process may include a dry etching process, a wet etching process, or a combination thereof.

Figure 2B:
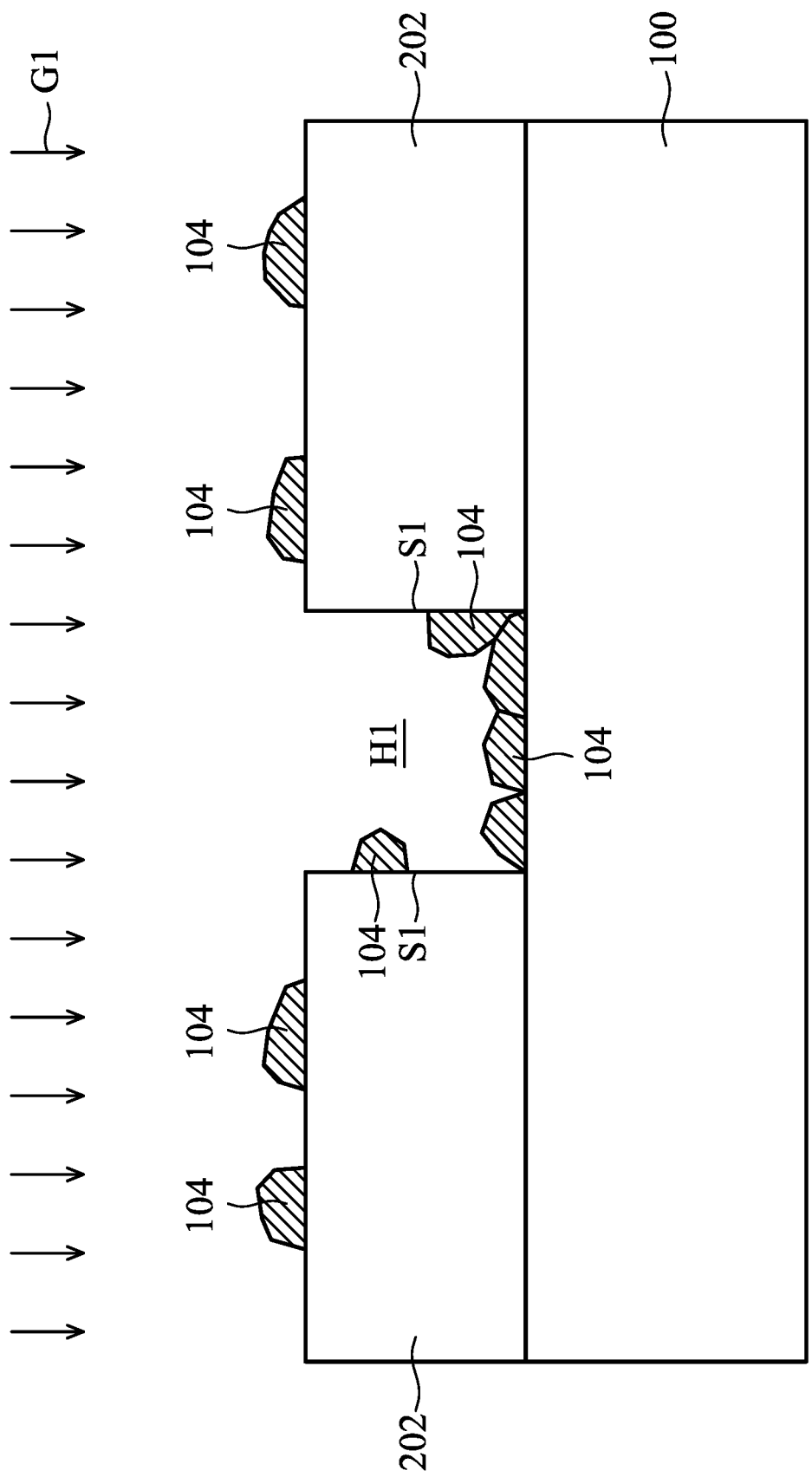

Afterwards, the first conductive structures 104 are formed on the sidewall surfaces S1 of the dielectric layer 202, the top surface of the dielectric layer 202 and the top surface of the semiconductor substrate 100, as shown in FIG. 2B in accordance with some embodiments. The sidewall surfaces S1 of the dielectric layer 202, the top surface of the dielectric layer 202, and the top surface of the semiconductor substrate 100 may be in direct contact with the first conductive structures 104. In some embodiments, the first conductive structures 104 are formed using a chemical vapor deposition process. In some embodiments, the chemical vapor deposition process for forming the first conductive structures 104 on the sidewall surfaces S1 of the dielectric layer 202 includes introducing the gas G1 into the trench H1.

The chemical vapor deposition process for forming the first conductive structures 104 may be performed in a deposition chamber. In some embodiments, after forming the trench H1, the semiconductor substrate 100 and the dielectric layer 202 are transferred into a deposition chamber, and then the gas G1 is introduced into the deposition chamber to form the first conductive structures 104 by a chemical vapor deposition. The parameters (e.g., flow rate, duration, pressure inside the deposition chamber, and deposition temperature) of the introduction of the gas G1 in the embodiments illustrated in FIGS. 1A-1E may also be applied to the embodiments illustrated in FIGS. 2A-2G In the interest of simplicity, the details will not be discussed again.

Figure 2C:
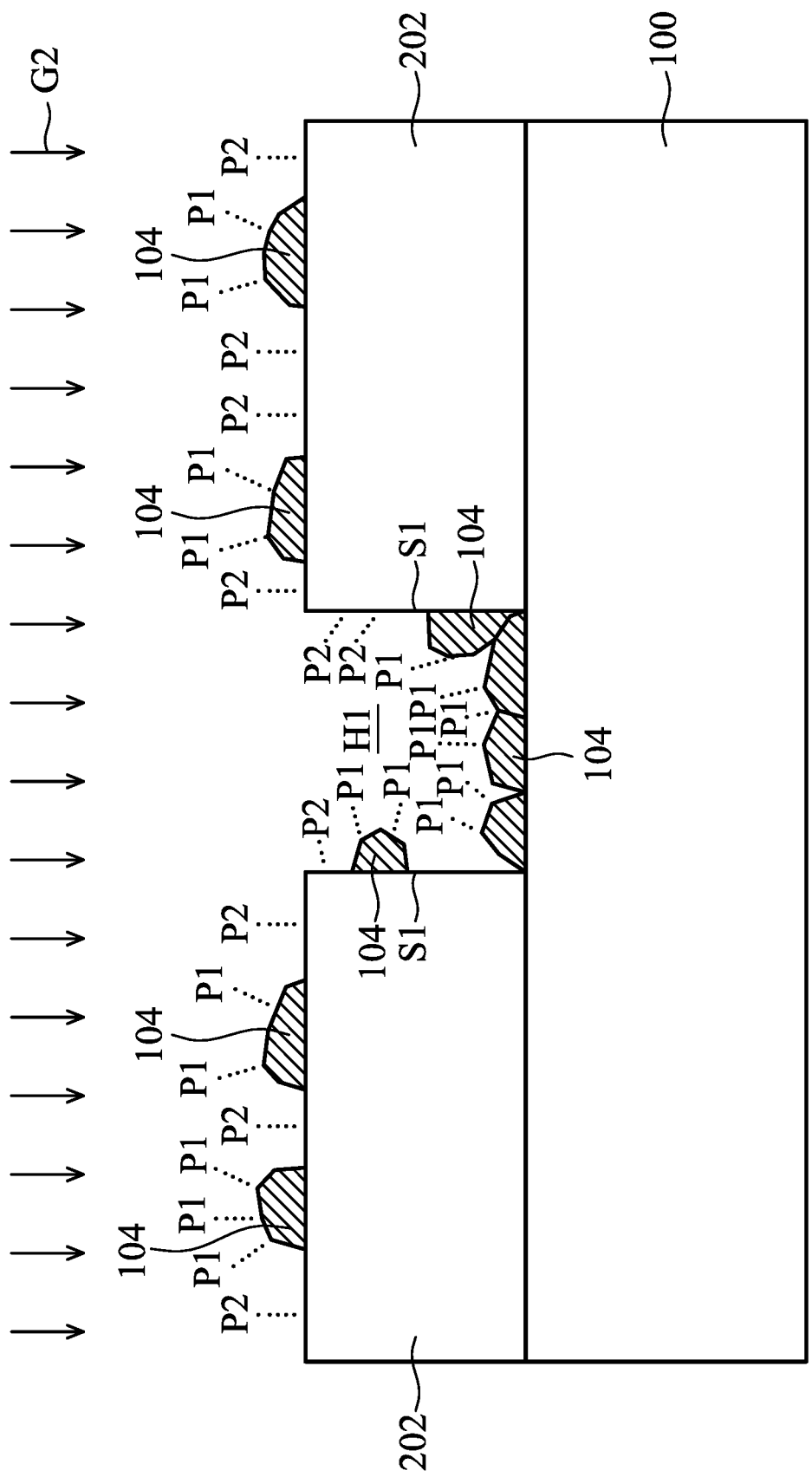

Afterwards, a modification process is performed to modify the surface properties of the first conductive structures 104, in accordance with some embodiments. In some embodiments, the modification process includes introducing the gas G2 on the surfaces of the first conductive structures 104, the exposed sidewall surfaces S1 and the exposed top surface of the dielectric layer 202 to modify the surface properties of the first conductive structures 104, as shown in FIG. 2C. The introduction of the gas G2 in the modification process may also modify the surface properties of the exposed sidewall surfaces S1 and the exposed top surface of the dielectric layer 202.

The gas G2 used in the modification process may passivate the surfaces of the first conductive structures 104. In some embodiments, the gas G2 also passivates the exposed sidewall surfaces S1 and the exposed top surface of the dielectric layer 202, but the passivating effect on the surfaces of the first conductive structures 104 is greater than the passivating effect on the exposed sidewall surfaces S1 and the exposed top surface of the dielectric layer 202. In some embodiments, due to the modification process, forming conductive structures on the surfaces of the first conductive structures 104 is more difficult than forming conductive structures on the exposed sidewall surfaces S1 and the exposed top surface of the dielectric layer 202.

In some embodiments, the portion P1 of the gas G2 is absorbed on the surface of the first conductive structure 104, and the portion P2 of the gas G2 is absorbed on the exposed sidewall surfaces S1 and the exposed top surface of the dielectric layer 202, as shown in FIG. 2C. The bonding strength between the first conductive structure 104 and the portion P1 of the gas G2 may be higher than the bonding strength between the dielectric layer 202 and the portion P2 of the gas G2. For example, the portion P1 of the gas G2 may be chemically absorbed on the surface of the first conductive structure 104, while the portion P2 of the gas G2 may be physically absorbed on the sidewall surfaces S1 and the top surface of the dielectric layer 202. For example, the portion P1 of the gas G2 may bind to the surface of the first conductive structure 104 by a chemical bond, while the portion P2 of the gas G2 may bind to the sidewall surfaces S1 and the top surface of the dielectric layer 202 by a physical bond.

In some embodiments, since the bonding strength between the first conductive structure 104 and the portion P1 of the gas G2 is greater than the bonding strength between the dielectric layer 202 and the portion P2 of the gas G2, the passivating effect of the gas G2 on the surface of the first conductive structure 104 is greater than the passivating effect of the gas G2 on the sidewall surfaces S1 and the top surface of the dielectric layer 202.

The gas G1 and the gas G2 may be introduced into the same deposition chamber. In some embodiments, after the formation of the first conductive structures 104, the gas G2 is introduced into the deposition chamber where the chemical vapor deposition for forming the first conductive structures 104 is performed.

The parameters (e.g., flow rate, duration, and pressure inside the deposition chamber) of the introduction of the gas G2 in the embodiments illustrated in FIGS. 1A-1E may also be applied to the embodiments illustrated in FIGS. 2A-2G In the interest of simplicity, the details will not be discussed again.

Figure 2D:
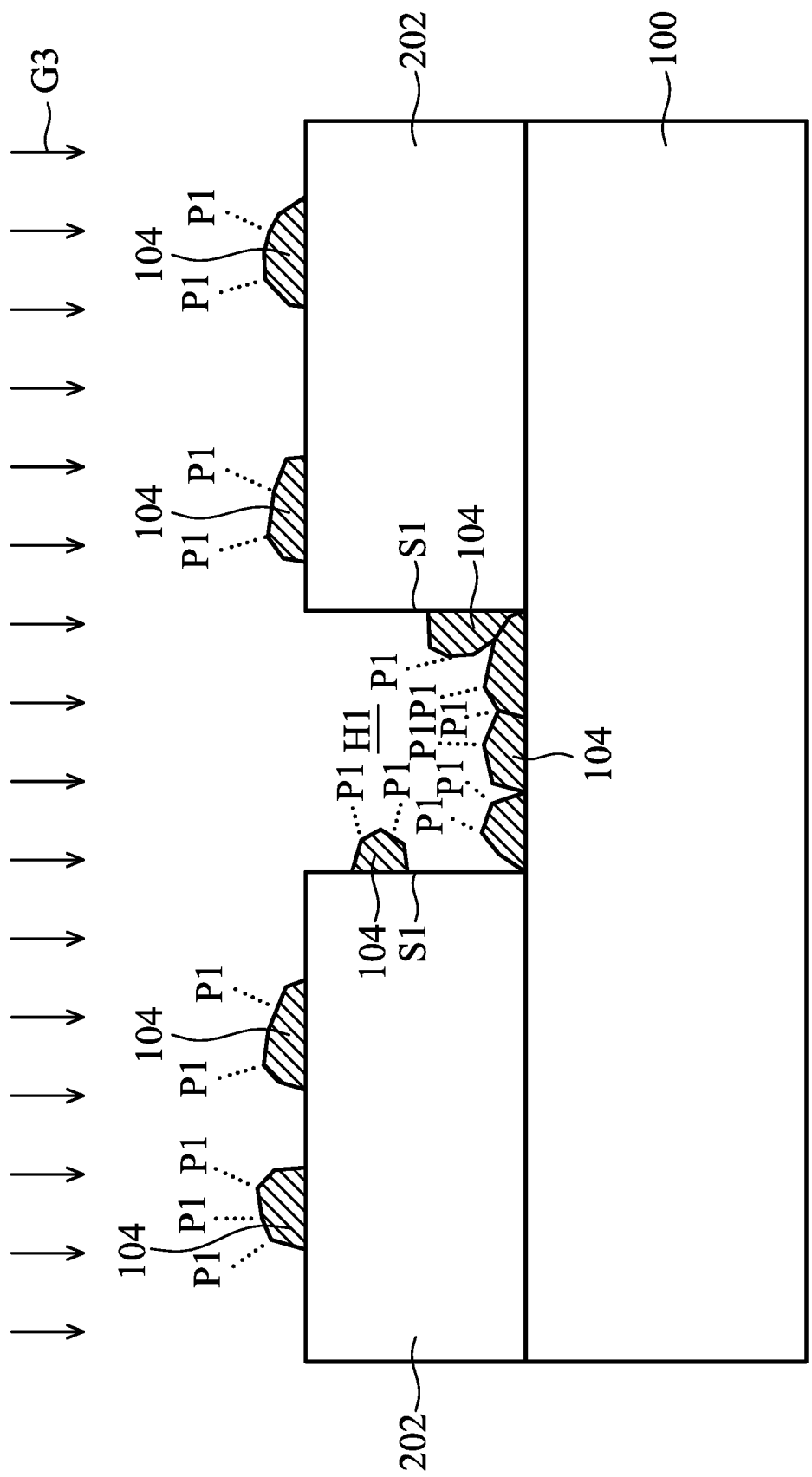

Afterwards, the purging gas G3 may be optionally introduced to purge the surfaces of the first conductive structures 104, the sidewall surfaces S1, and/or the top surface of the dielectric layer 202, as shown in FIG. 2D in accordance with some embodiments. The purging gas G3 may be introduced into the trench H1 to purge the first conductive structures 104 in the trench H1 and/or the sidewall surfaces S1 of the dielectric layer 202.

In some embodiments, the portion P2 of the gas G2 is removed from the sidewall surfaces S1 and the top surface of the dielectric layer 202 by purging these surfaces with the purging gas G3, as shown in FIG. 2D. In some embodiments, the portion P2 of the gas G2 is removed from the sidewall surfaces S1 and the top surface of the dielectric layer 202 by the purging gas G3 while the portion P1 of the gas G2 still remains on the surfaces of the first conductive structures 104. Therefore, in these embodiments, by introducing the purging gas G3, the passivating effect of the gas G2 on sidewall surfaces S1 and the top surface of the dielectric layer 202 becomes further lower than the passivating effect of the gas G2 on the surfaces of the first conductive structures 104.

The purging gas G3, the gas G2 and the gas G1 may be introduced into the same deposition chamber. The parameters (e.g., flow rate, duration, and pressure inside the deposition chamber) of the introduction of the gas G3 in the embodiments illustrated in FIGS. 1A-1E may also be applied to the embodiments illustrated in FIGS. 2A-2G In the interest of simplicity, the details will not be discussed again.

Figure 2E:
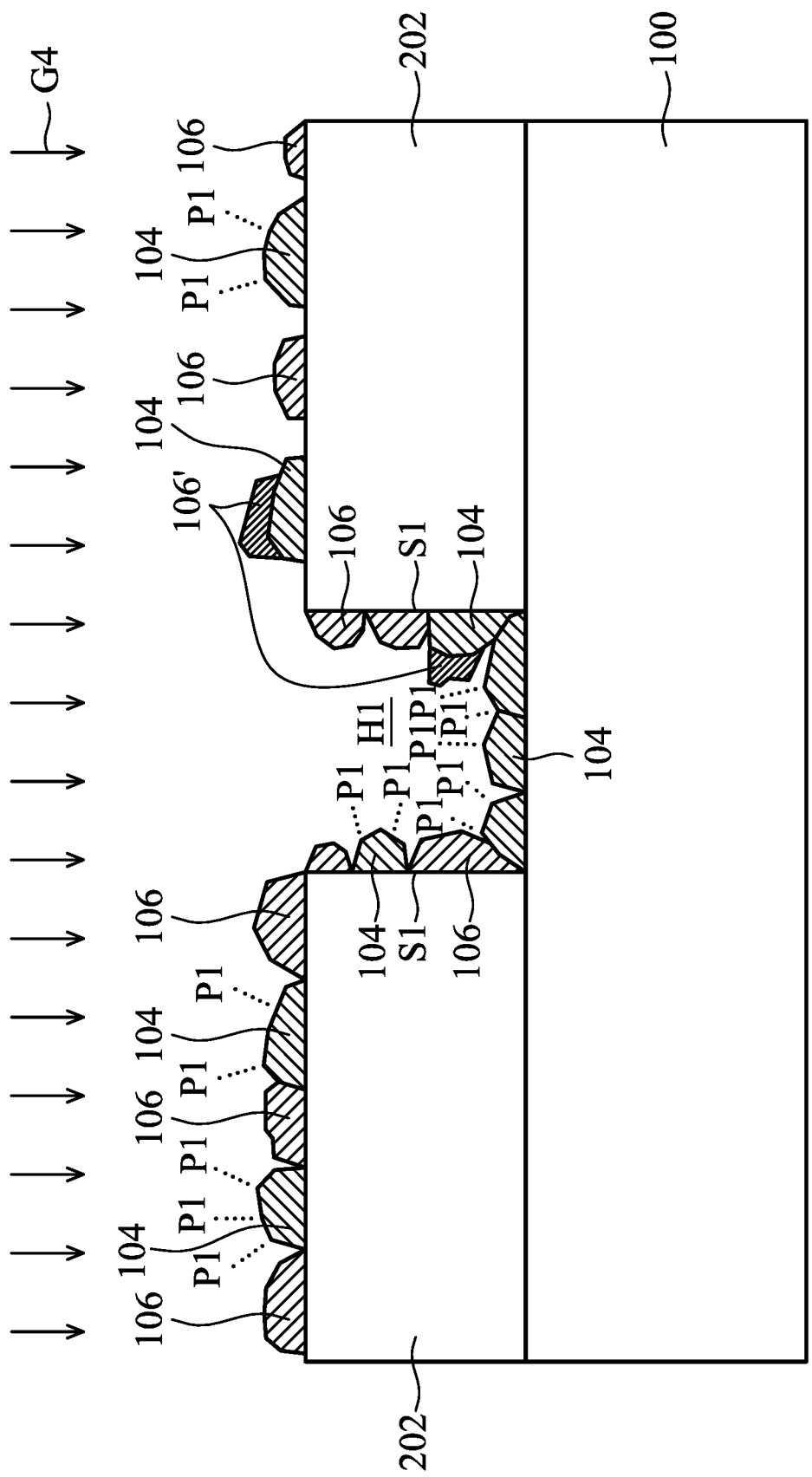

Afterwards, second conductive structures 106 are formed on the exposed sidewall surfaces S1 and the exposed top surface of the dielectric layer 202, as shown in FIG. 2E in accordance with some embodiments. The sidewall surfaces S1 and the top surface of the dielectric layer 202 may be in direct contact with the second conductive structures 106.

In some embodiments, since the passivating effect of the gas G2 on the surfaces of the first conductive structures 104 is greater than the passivating effect of the gas G2 on the exposed sidewall surfaces S1 and the exposed top surface of the dielectric layer 202, conductive structures (e.g., the second conductive structures 106) tend to form directly on the exposed sidewall surfaces S1 and the exposed top surface of the dielectric layer 202 rather than form directly on the surfaces of the first conductive structures 104. Therefore, in these embodiments, a conductive structure made of the first conductive structures 104 and the second conductive structures 106 can have fewer defects (e.g., voids or seams).

In some embodiments, the second conductive structures 106 are formed on the exposed sidewall surfaces S1 and the exposed top surface of the dielectric layer 202 using a chemical vapor deposition process. In some embodiments, the chemical vapor deposition process for forming the second conductive structures 106 includes introducing the gas G4 on the sidewall surfaces S1 and the top surface of the dielectric layer 202, as shown in FIG. 2E. The gas G4 may be introduced into the trench H1 to form the second conductive structures 106 in the trench H1. In some embodiments, the metal in the precursor in the gas G4 is deposited on the exposed sidewall surfaces S1 and the exposed top surface of the dielectric layer 202 by a chemical vapor deposition to form the second conductive structures 106.

In some embodiments, the chemical vapor deposition for forming the first conductive structures 104 and the chemical vapor deposition for forming the second conductive structures 106 are performed in-situ in the same deposition chamber.

The parameters (e.g., flow rate, duration, pressure inside the deposition chamber, and the deposition temperature) of the introduction of the gas G4 in the embodiments illustrated in FIGS. 1A-1E may also be applied to the embodiments illustrated in FIGS. 2A-2G In the interest of simplicity, the details will not be discussed again.

In some embodiments, during the chemical vapor deposition for forming the second conductive structures 106, conductive structures 106' may also be formed on the first conductive structures 104. The conductive structure 106' may be in direct contact with the first conductive structure 104 but not in direct contact with the dielectric layer 202. In some embodiments, the amount and/or the deposition rate of the second conductive structure 106 is greater than those of the conductive structure 106', reducing the defects (e.g., voids or seams) formed in a conductive structure made of the first conductive structures 104, the second conductive structures 106 and the conductive structures 106'.

Figure 2F:
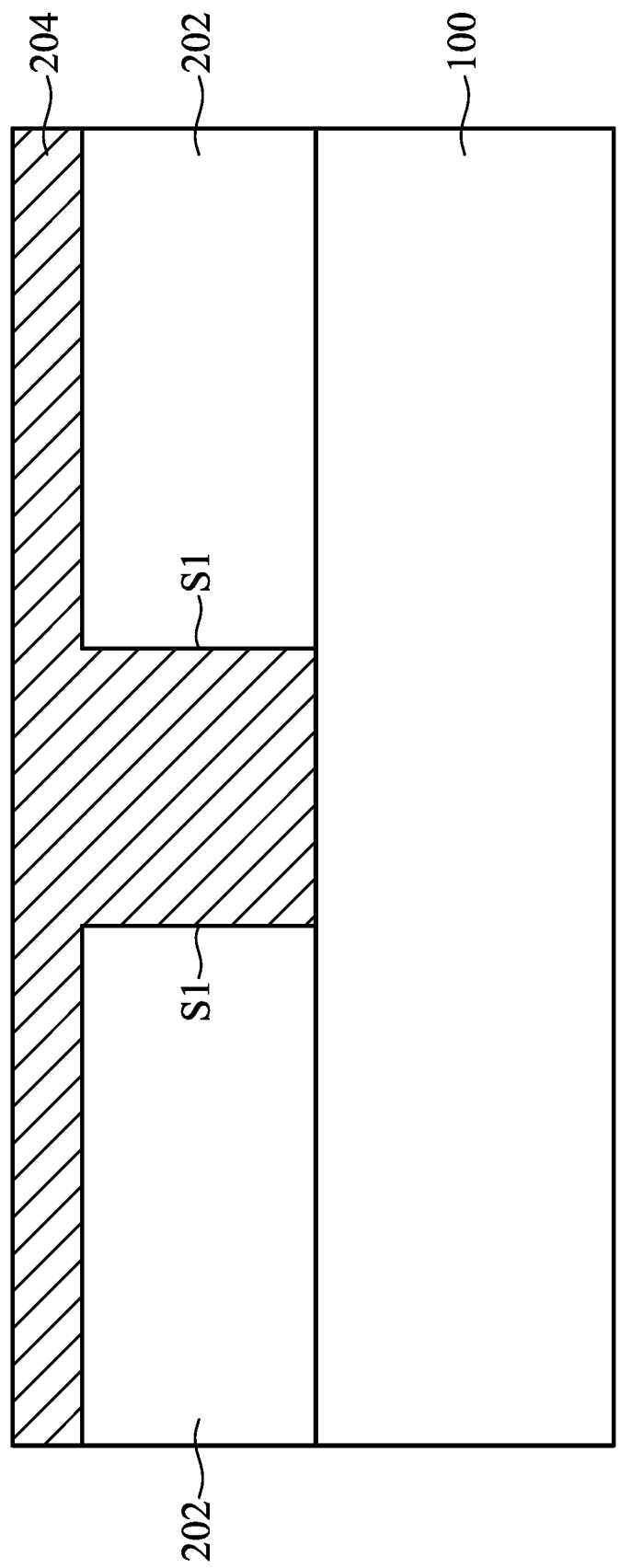

Afterwards, the trench H1 is filled with a conductive structure 204, as shown in FIG. 2F in accordance with some embodiments. In some embodiments, the conductive structure 204 is formed by repeating the deposition-modification cycle, and the conductive structure 204 includes conductive structures formed by each deposition-modification cycle. These deposition-modification cycles for forming the conductive structure 204 may be performed in-situ in the same deposition chamber.

In some embodiments, the conductive structure 204 formed by repeating the deposition-modification cycle is smooth and has fewer defects, and thus the adhesion between the dielectric layer 202 and the conductive structure 204 is good and no additional adhesion layer between the conductive structure 204 and the sidewall surfaces S1 of the dielectric layer 202 is needed. In some embodiments, the conductive structure 204 is formed by performing the deposition-modification cycle between 10 and 60 times.

In some embodiments, by repeating the deposition-modification cycle, a metal (e.g., Ru, Ir, Rh, Mo, Ni, or Pt) whose diffusivity in the dielectric layer 202 is low can be used to form the conducive structure 204 in the dielectric layer 202 without increasing defects (e.g., voids or seams) in the conductive structure 204, and thus no additional diffusion barrier layer between the conductive structure 204 and the sidewall surfaces S1 of the dielectric layer 202 is needed.

In some embodiments, by repeating the deposition-modification cycle, a metal (e.g., Ru, Ir, Rh, Mo, Ni, or Pt) whose mean free path is low can be used to form the conducive structure 204 without increasing defects (e.g., voids or seams) in the conductive structure 204, and thus the conductive structure 204 has lower resistance.

Figure 2G:
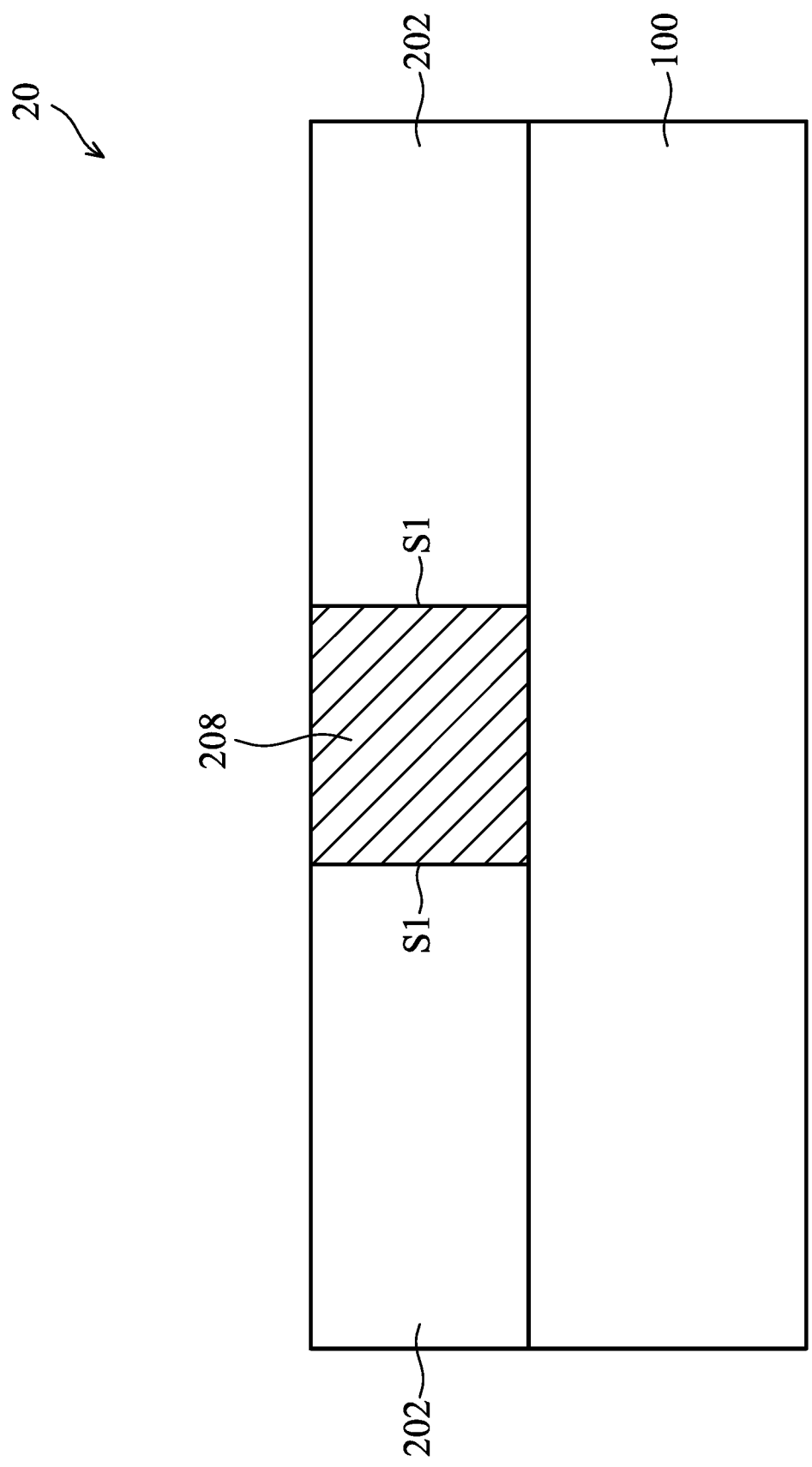

Afterwards, a planarization process (e.g., a chemical mechanical polishing process or an etch back process) is performed to remove the top portion of the conductive structure 204 to form a semiconductor structure 20, as shown in FIG. 2G in accordance with some embodiments. In some embodiments, after the planarization process, the remaining portion of the conductive structure 204 in the trench H1 serves as a conductive structure 208 of the semiconductor structure 20. The conductive structure 208 may be a source/drain contact structure, a conductive via structure, or a gate electrode layer. In some embodiments, the top surface of the conductive structure 208 is substantially level with the top surface of the dielectric layer 202.

FIGS. 3A to 3F are perspective representations of various stages of a method for forming a semiconductor structure, in accordance with some embodiments of the disclosure. FIG. 4A is a cross-sectional representation taken along the cut line A-A of FIG. 3F. FIG. 4B is a cross-sectional representation which illustrates a stage following the stage illustrated in FIG. 4A of a method for forming a semiconductor structure, in accordance with some embodiments.

Figure 3A:
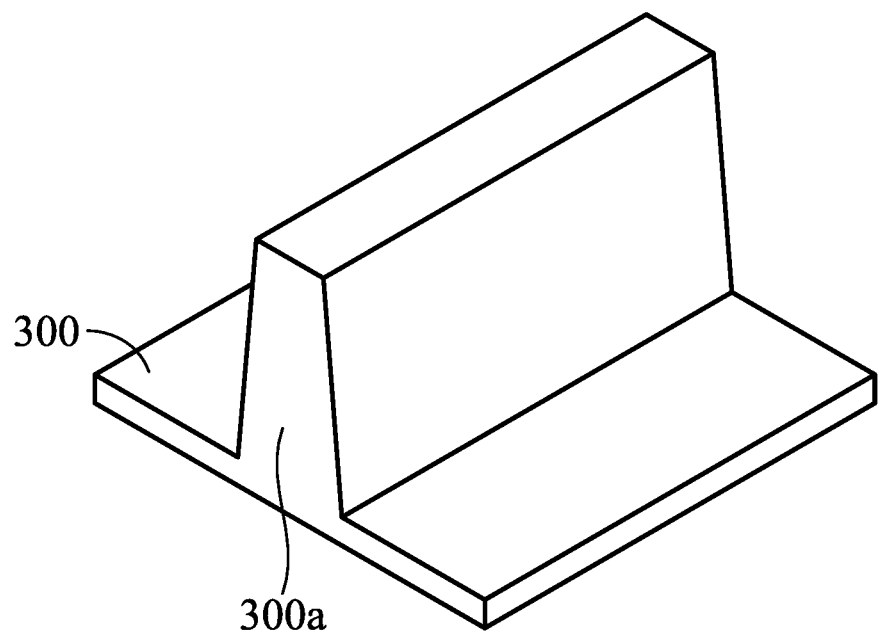
FIGS. 3A, 3B, 3C, 3D, 3E, and 3F are a series of perspective views illustrating various stages of a method for forming a semiconductor structure in accordance with some embodiments.
Figure 4A:
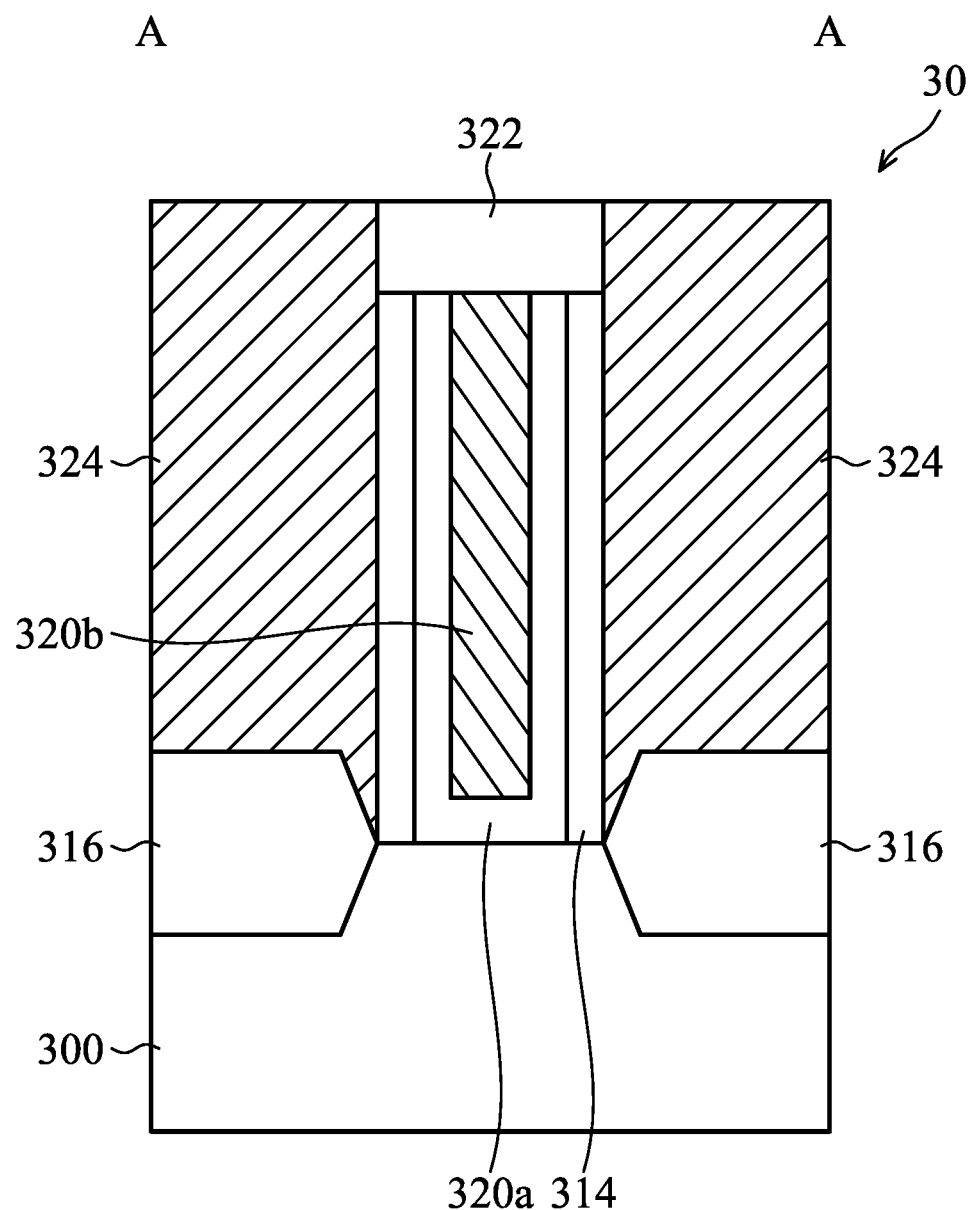
FIGS. 4A and 4B are a series of cross-sectional views which are taken along the cut line A-A of FIG. 3F and illustrate various stages of a method for forming a semiconductor structure in accordance with some embodiments.
Figure 4B:
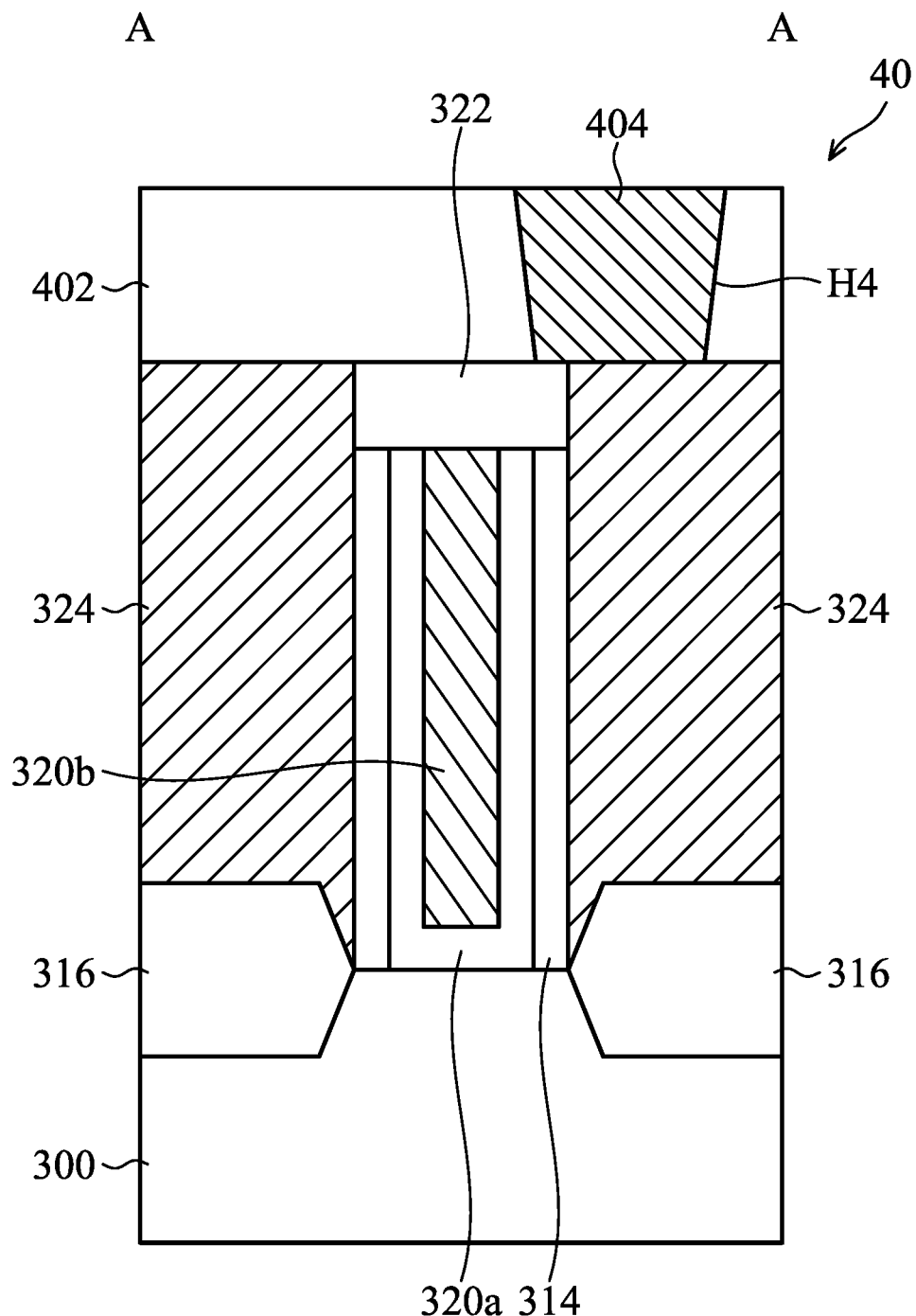

A semiconductor substrate 300 is provided, as shown in FIG. 3A in accordance with some embodiments. The semiconductor substrate 300 may be the same as or similar to the semiconductor substrate 100 of the above embodiments. In the interest of simplicity, the details will not be discussed again.

Afterwards, a fin structure 300a is formed on the semiconductor substrate 300, as shown in FIG. 3A in accordance with some embodiments. The fin structure 300a may be formed by patterning the semiconductor substrate 300 using a lithography process, an etching process, another applicable process, or a combination thereof. In some embodiments, the fin structure 300a has a width that gradually increases from the top portion to the lower portion, as shown in FIG. 3A.

Figure 3B:
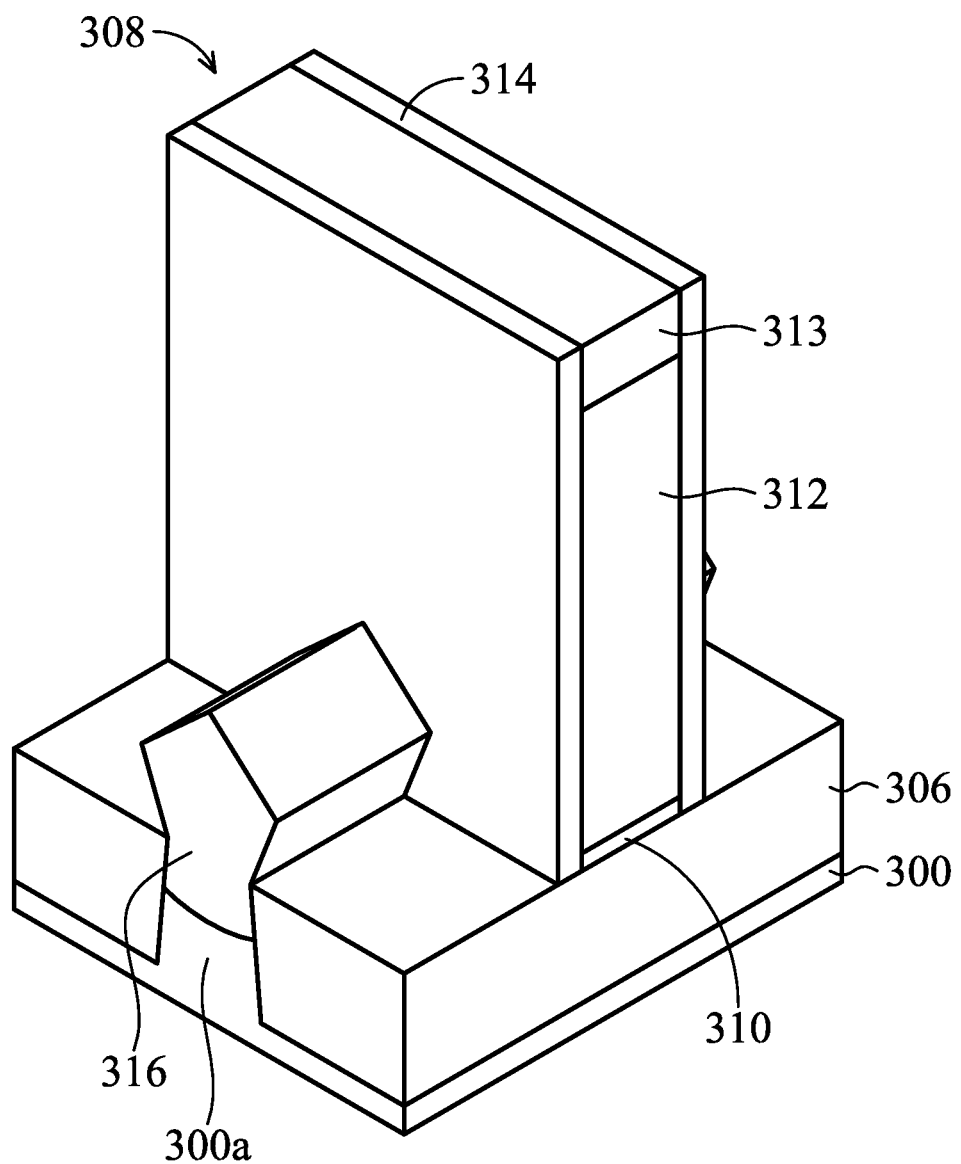

After the fin structure 300a is formed, an isolation structure 306 is formed over the substrate 300, and the fin structure 300a is surrounded by the isolation structure 306, as shown in FIG. 3B in accordance with some embodiments. The isolation structure 306 may be formed by depositing an insulating layer over the substrate 300 and recessing the insulating layer. In some embodiments, the isolation structure 306 is made of silicon oxide, silicon nitride, silicon oxynitride, fluoride-doped silicate glass (FSG), other applicable dielectric materials, or a combination thereof.

Afterwards, a dummy gate structure 308 is formed across the fin structure 300a and extends over the isolation structure 306, as shown in FIG. 3B in accordance with some embodiments. The dummy gate structure 308 may include a dummy gate dielectric layer 310, a dummy gate electrode layer 312, and a capping layer 313.

The dummy gate dielectric layer 310 may be made of silicon oxide, other applicable dielectric materials, or a combination thereof. The dummy gate electrode layer 312 may be made of poly-silicon, or other applicable materials. The capping layer 313 may be made of silicon nitride, or other applicable materials. The dummy gate dielectric layer 310, the dummy gate electrode layer 312, and the capping layer 313 may be formed by suitable deposition processes (e.g., chemical vapor deposition process, and physical vapor deposition process).

After the dummy gate structure 308 is formed, spacers 314 are formed on sidewalls of the dummy gate structure 308, as shown in FIG. 3B in accordance with some embodiments. In some embodiments, the spacers 314 are made of silicon nitride, silicon oxide, other applicable materials, or a combination thereof. In some embodiments, the spacers 314 are formed by a deposition process (e.g., a chemical vapor deposition process) followed by an anisotropic etching process.

Afterwards, source/drain (S/D) structures 316 are formed over and/or in the fin structure 300a, as shown in FIG. 3B in accordance with some embodiments. In some embodiments, portions of the fin structure 300a adjacent to the dummy gate structure 308 are recessed to form recesses, and a strained material is grown in the recesses by an epitaxial (epi) process to form the S/D structures 316. In addition, the lattice constant of the strained material may be different from the lattice constant of the semiconductor substrate 300. In some embodiments, the S/D structures 316 include Si, Ge, SiGe, InAs, InGaAs, InSb, GaAs, GaSb, InAlP, InP, other applicable materials, or a combination thereof.

Figure 3C:
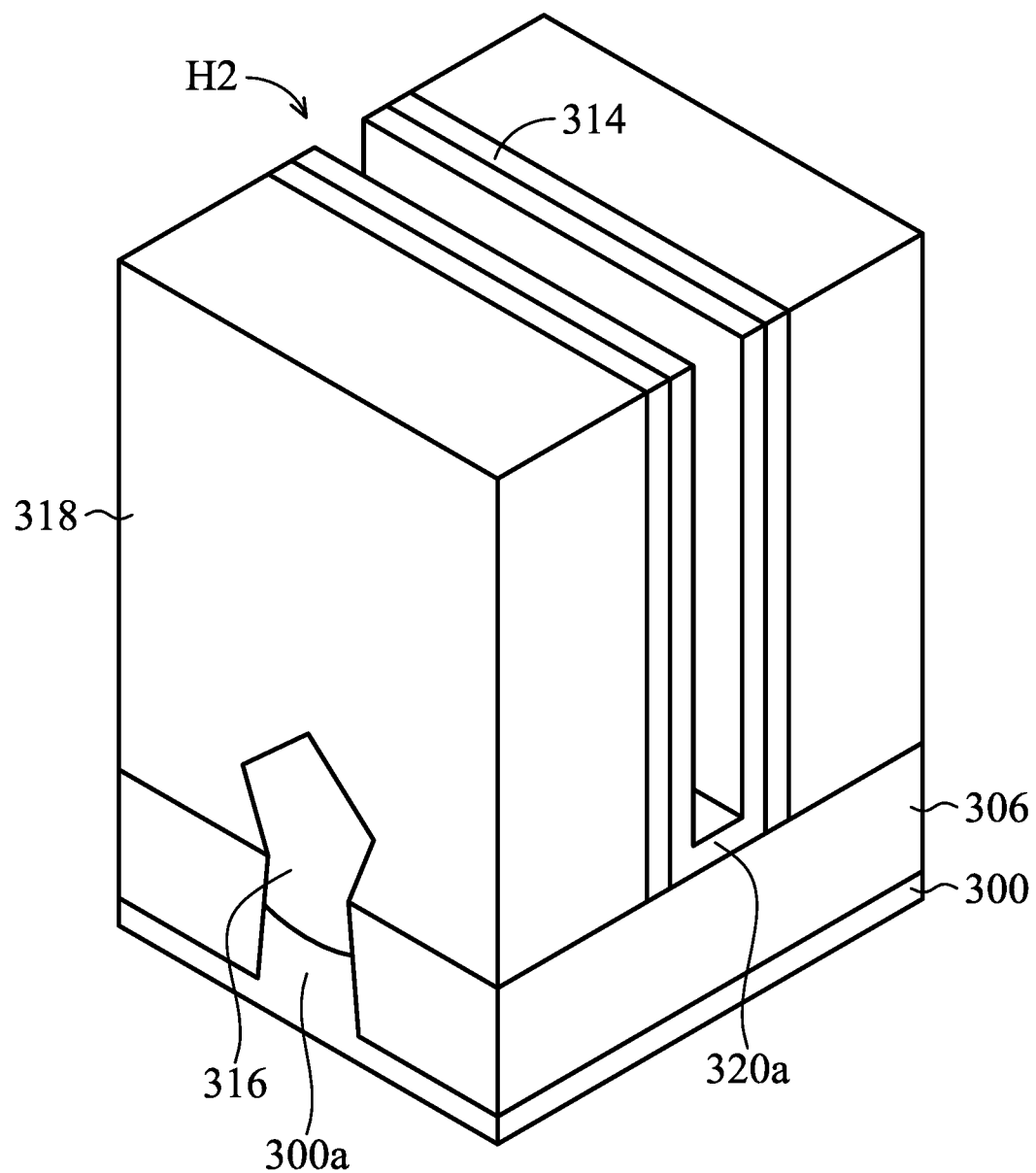

After the source/drain structures 316 are formed, a dielectric layer (e.g., an interlayer dielectric layer) 318 is formed over the semiconductor substrate 300 and the fin structure 300a, as shown in FIG. 3C in accordance with some embodiments. The dielectric layer 318 may cover the source/drain structures 316. The materials and methods for forming the dielectric layer 318 may be the same as or similar to those of the dielectric structure 102 and the dielectric layer 202 of the above embodiments, and the details will not be discussed again.

Afterwards, the dummy gate structure 308 is removed to form a trench (or recess) H2 in the dielectric layer 318, and a gate dielectric layer 320a is formed in the trench H2 in the dielectric layer 318, as shown in FIG. 3C in accordance with some embodiments. The trench H2 may be formed using a dry etching process, a wet etching process, or a combination thereof. The materials and methods for forming the gate dielectric layer 320a may be the same as or similar to those of the dielectric structure 102 and the dielectric layer 202 of the above embodiments, and the details will not be discussed again.

Figure 3D:
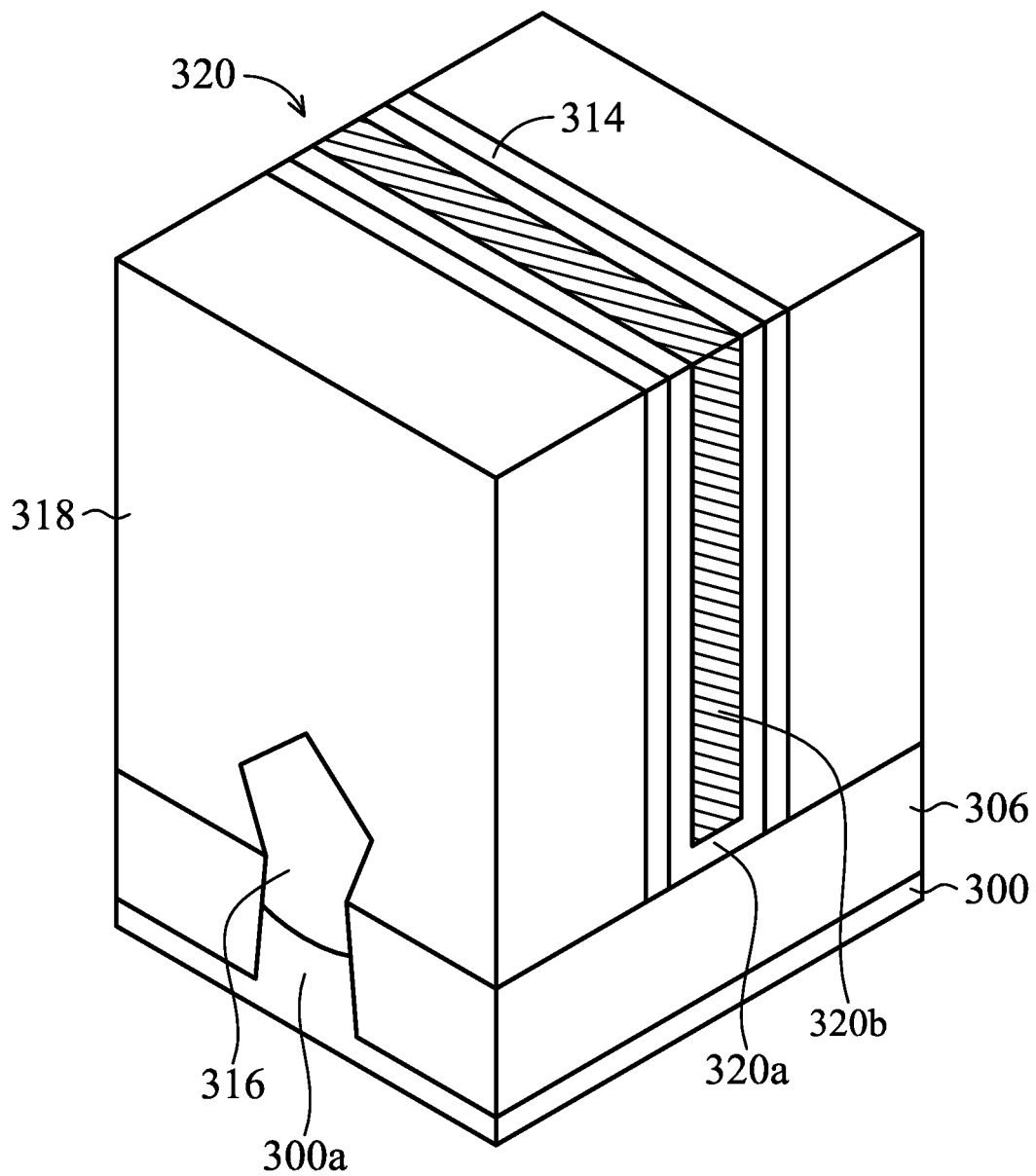

Afterwards, a gate electrode layer 320b is formed on the gate dielectric layer 320a in the trench H2, as shown in FIG. 3D in accordance with some embodiments. The gate electrode layer 320b combined with the gate dielectric layer 320a may be referred to as a gate stack 320. The materials and methods for forming the gate electrode layer 320b may be the same as or similar to those of the conductive structure 108 and the conductive structure 208 of the above embodiments, and the details will not be discussed again.

In some embodiments, the gate dielectric layer 320a is similar to the dielectric structure 102 and the dielectric layer 202 of the above embodiments, and the gate electrode layer 320b is similar to the conductive structure 108 and the conductive structure 208 of the above embodiments. In these embodiments, the gate electrode layer 320b is formed on the surfaces of the gate dielectric layer 302a by repeating the deposition-modification cycle, and thus the gate electrode layer 320b has fewer defects (e.g., voids or seams).

Figure 3E:
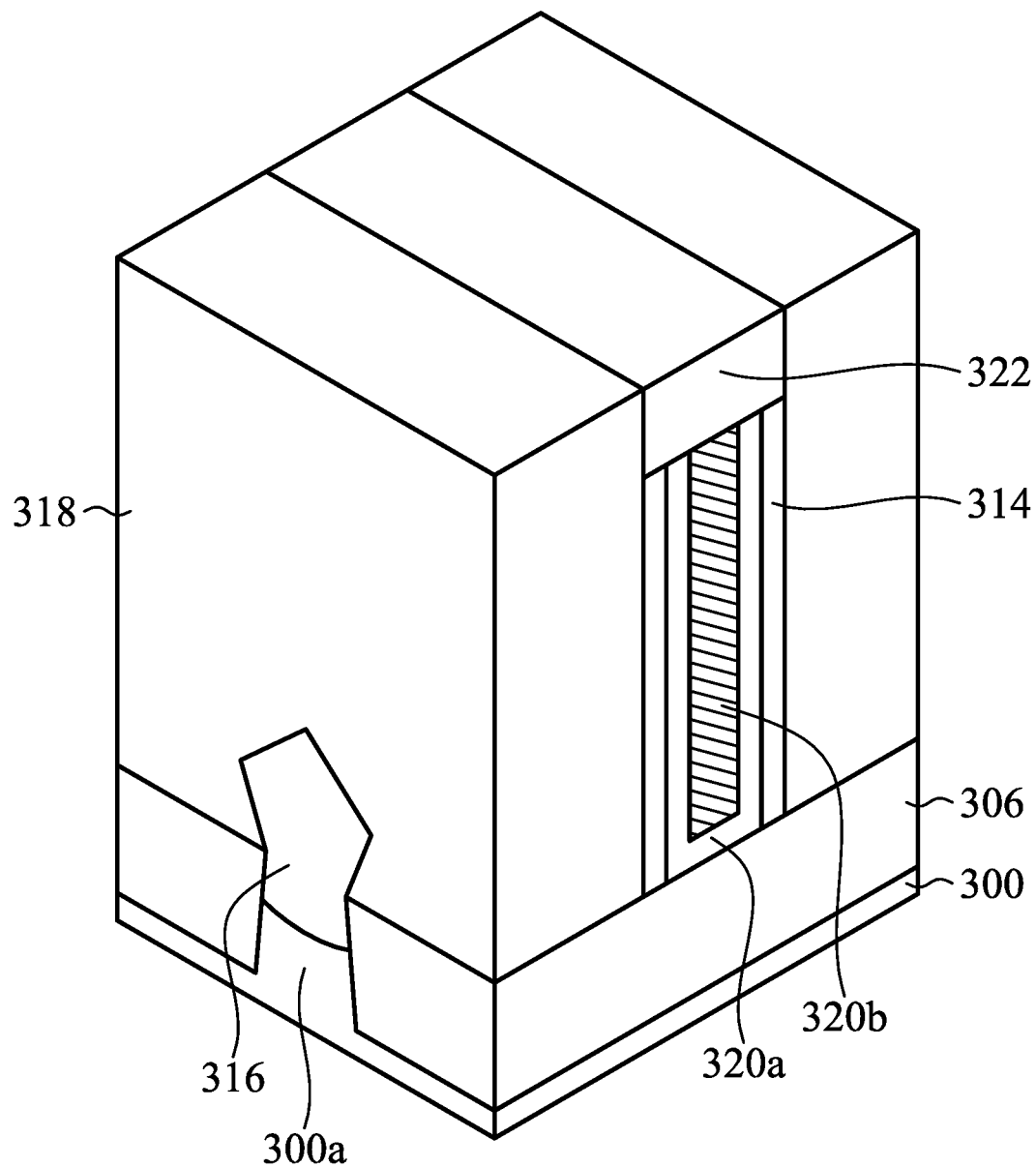

Afterwards, the gate stack 320 is recessed by an applicable process (e.g., a dry etching process, a wet etching process, or a combination thereof), and a hard mask 322 is formed on the gate stack 320, as shown in FIG. 3E in accordance with some embodiments. The hard mask 322 may be formed by a chemical vapor deposition process, another applicable process, or a combination thereof.

Figure 3F:
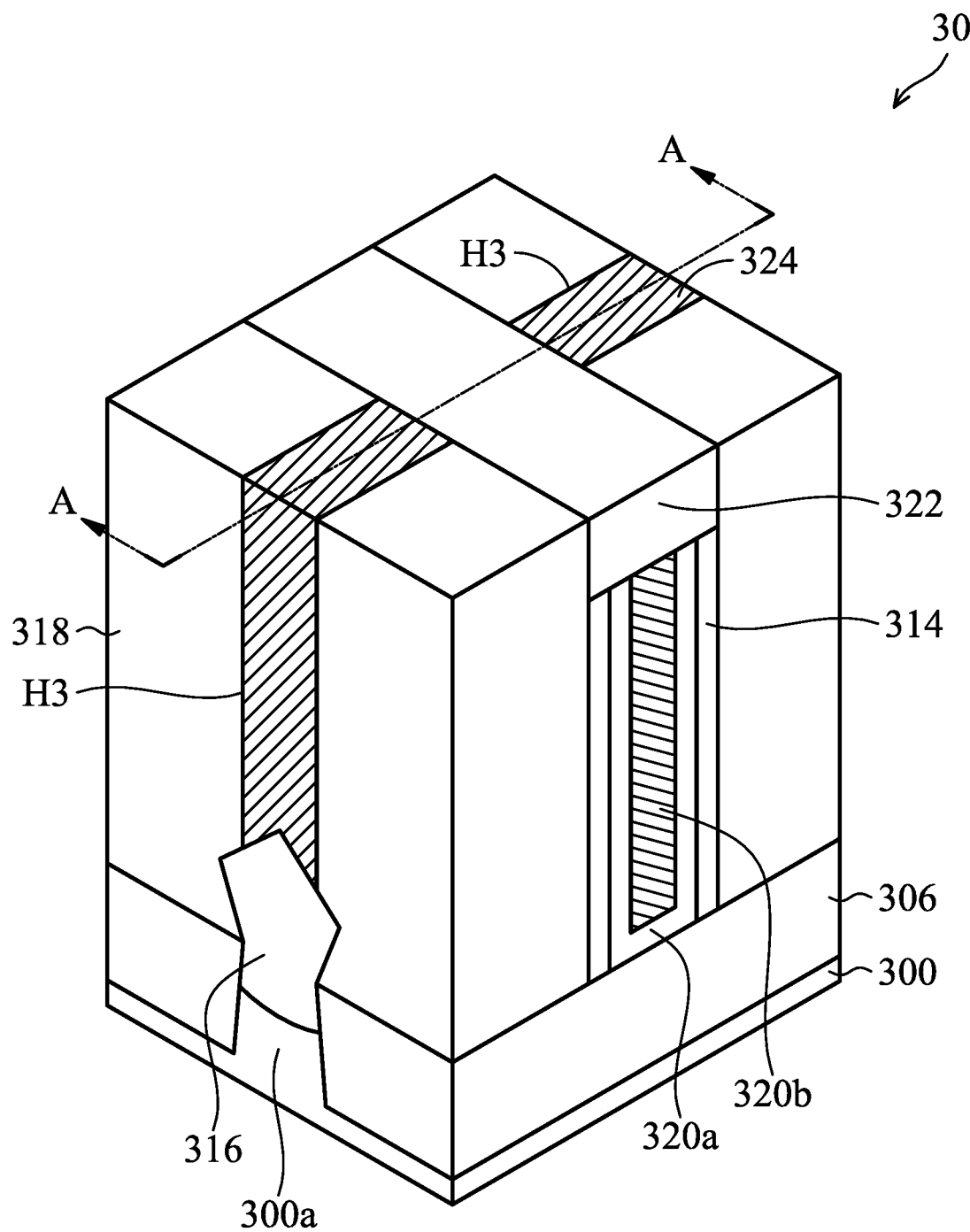

Afterwards, trenches (or openings) H3 are formed in the dielectric layer 318 to expose the source/drain structures 316, and source/drain (S/D) contact structures 324 are formed in the trenches H3 to form a semiconductor structure 30, as shown in FIGS. 3F and 4A in accordance with some embodiments. The trenches H3 may be also referred to as contact holes H3. The trenches H3 may be formed by a lithography process followed by an etching process. The hard mask 322 and the dielectric layer 318 may be made of different materials. The etching selectivity of the hard mask 322 with respect to the dielectric layer 318 may be high enough. Therefore, the etching process for forming the trenches H3 is a self-aligned etching process, in accordance with some embodiments.

The materials and methods for forming the source/drain contact structures 324 may be the same as or similar to those for forming the conductive structure 108 and the conductive structure 208 of the above embodiments, and the details will not be discussed again.

In some embodiments, the dielectric layer 318 is similar to the dielectric structure 102 and the dielectric layer 202 of the above embodiments, and the source/drain contact structure 324 is similar to the conductive structure 108 and the conductive structure 208 of the above embodiments. In these embodiments, the source/drain contact structure 324 is formed on the surfaces (e.g., sidewall surfaces of the dielectric layer 318 defining the trench H3) of the dielectric layer 318 by repeating the deposition-modification cycle, and thus the source/drain contact structure 324 has fewer defects (e.g., voids or seams) and lower resistance, improving the performance of the semiconductor structure 30.

In some embodiments, the source/drain contact structure 324 formed by repeating the deposition-modification cycle is smooth and has fewer defects, and thus the adhesion between the dielectric layer 318 and the source/drain contact structure 324 is good and no additional adhesion layer between the source/drain contact structure 324 and the dielectric layer 318 is needed.

In some embodiments, by repeating the deposition-modification cycle, a metal (e.g., Ru, Ir, Rh, Mo, Ni, or Pt) whose diffusivity in the dielectric layer 318 is low can be used to form the source/drain contact structure 324 in the dielectric layer 318 without increasing defects (e.g., voids or seams) in the source/drain contact structure 324, and thus no additional diffusion barrier layer between the source/drain contact structure 324 and the dielectric layer 318 is needed. In some embodiments, the source/drain contact structure 324 is in direct contact with the sidewall surfaces of the dielectric layer 318.

In some embodiments, by repeating the deposition-modification cycle, a metal (e.g., Ru, Ir, Rh, Mo, Ni, or Pt) whose mean free path is low can be used to form the source/drain contact structure 324 without increasing defects (e.g., voids or seams) in the source/drain contact structure 324, and thus the source/drain contact structure 324 has lower resistance.

Afterwards, a dielectric layer 402 is formed on the S/D contact structures 324 and the hard mask 322, as shown in FIG. 4B in accordance with some embodiments. The dielectric layer 318 may be between the dielectric layer 402 and the semiconductor substrate 300. In some embodiments, the dielectric layer 402 is formed on the dielectric layer 318, and the methods and materials for forming the dielectric layer 402 may be the same as or similar to those for forming the dielectric layer 318.

Afterwards, a trench (or opening) H4 is formed in the dielectric layer 402, and a conductive via structure 404 is formed in the trench H4 to form a semiconductor structure 40, as shown in FIG. 4B in accordance with some embodiments. The trench H4 may be formed by a lithography process followed by an etching process. The etching selectivity of the hard mask 322 with respect to the dielectric layer 402 may be high, and the etching process for forming the trench H4 may be a self-aligned etching process.

In some embodiments, the conductive via structure 404 is electrically connected to the S/D contact structure 324. The conductive via structure 404 may be in direct contact with the S/D contact structure 324.

The materials and methods for forming the conductive via structure 404 may be the same as or similar to those for forming the conductive structure 108 and the conductive structure 208 of the above embodiments, and the details will not be discussed again.

In some embodiments, the dielectric layer 402 is similar to the dielectric structure 102 and the dielectric layer 202 of the above embodiments, and the conductive via structure 404 is similar to the conductive structure 108 and the conductive structure 208 of the above embodiments. In these embodiments, the conductive via structure 404 is formed on the surfaces (e.g., sidewall surfaces of the dielectric layer 402 defining the trench H4) of the dielectric layer 402 by repeating the deposition-modification cycle, and thus the conductive via structure 404 has fewer defects (e.g., voids or seams) and lower resistance, improving the performance of the semiconductor structure 40.

In some embodiments, the conductive via structure 404 formed by repeating the deposition-modification cycle is smooth and has fewer defects, and thus the adhesion between the dielectric layer 402 and the conductive via structure 404 is good and no additional adhesion layer between the conductive via structure 404 and the dielectric layer 402 is needed.

In some embodiments, by repeating the deposition-modification cycle, a metal (e.g., Ru, Ir, Rh, Mo, Ni, or Pt) whose diffusivity in the dielectric layer 402 is low can be used to form the conductive via structure 404 in the dielectric layer 402 without increasing defects (e.g., voids or seams) in the conductive via structure 404, and thus no additional diffusion barrier layer between the conductive via structure 404 and the dielectric layer 402 is needed. In some embodiments, the conductive via structure 404 is in direct contact with the sidewall surfaces of the dielectric layer 402.

In some embodiments, by repeating the deposition-modification cycle, a metal (e.g., Ru, Ir, Rh, Mo, Ni, or Pt) whose mean free path is low can be used to form the conductive via structure 404 without increasing defects (e.g., voids or seams) in the conductive via structure 404, and thus the conductive via structure 404 has lower resistance.

As described previously, in some embodiments, the method for forming the conductive structure 108 on the dielectric structure 102 includes introducing the gas G1 on the dielectric structure 102 to form the first conductive structure 104, introducing the gas G2 on the first conductive structure 104, and introducing the gas G4 on the first conductive structure 104 and the dielectric structure 102 to form the second conductive structure 106. The gas G4 may passivate the surface of the first conductive structure 104, so that the conductive structure 108 made of the first conductive structure 104 and the second conductive structure 106 may have fewer defects.

As described previously, in some embodiments, the method for forming the conductive structure 208 in the trench H1 includes introducing the gas G1 into the trench H1 to form the first conductive structure 104, introducing the gas G2 into the trench H1, and introducing the gas G4 into the trench H1 to form the second conductive structure 106. The gas G4 may passivate the surface of the first conductive structure 104. Therefore, the conductive structure 208 including the first conductive structure 104 and the second conductive structure 106 may have fewer defects.

Embodiments of methods for forming semiconductor structures are provided. The method for forming semiconductor structure includes introducing a first gas on a dielectric structure to form first conductive structures on the dielectric structure, introducing a second gas different from the first gas on the dielectric structure, and introducing a third gas on the dielectric structure to form second conductive structures on the dielectric structure. The second gas may passivate the surfaces of the first conductive structures, so that a conductive structure including the first conductive structures and the second conductive structures may have fewer defects (e.g., voids or seams).

In some embodiments, a method for forming a semiconductor structure is provided. The method includes forming a dielectric structure on a semiconductor substrate, introducing a first gas on the dielectric structure to form first conductive structures on the dielectric structure, and introducing a second gas on the first conductive structures and the dielectric structure. The second gas is different from the first gas. The method also includes introducing a third gas on the first conductive structures and the dielectric structure to form second conductive structures on the dielectric structure. The first gas and the third gas comprise the same metal.

In some embodiments, a method for forming a semiconductor structure is provided. The method includes forming a dielectric layer on a semiconductor substrate, and etching the dielectric layer to form a trench in the dielectric layer. The trench is defined by sidewalls of the dielectric layer. The method also includes introducing a first precursor into the trench to form first conductive structures on the sidewalls of the dielectric layer. The first conductive structures are made of Ru, and the first precursor comprises $Ru_3(CO)_{12}$, $Ru(CO)_5$, $C_{10}H_{10}Ru$, $Ru(CO)_3C_6H_8$, $Ru(CO)_2(tmhd)_2$, $Ru(CO)_2(acac)_2$, $Ru(C_6H_6)(C_6H_8)$, $Ru(acac)_3$, $RuO_4$, $Ru(EtCp)_2$, RuCpPy, Ru Carbonyl diketone derivatives, Ru cyclopentadienyl derivatives, or a combination thereof. The method also includes introducing a first gas into the trench. A first portion of the first gas is absorbed on surfaces of the first conductive structures, and a second portion of the first gas is absorbed on sidewalls of the dielectric layer. The method also includes introducing a second precursor into the trench to form second conductive structures on the sidewalls of the dielectric layer. The second conductive structures are made of Ru, and the second precursor comprises $Ru_3(CO)_{12}$, $Ru(CO)_5$, $C_{10}H_{10}Ru$, $Ru(CO)_3C_6H_8$, $Ru(CO)_2(tmhd)_2$, $Ru(CO)_2(acac)_2$, $Ru(C_6H_6)(C_6H_8)$, $Ru(acac)_3$, $RuO_4$, $Ru(EtCp)_2$, RuCpPy, Ru Carbonyl diketone derivatives, Ru cyclopentadienyl derivatives, or a combination thereof.

In some embodiments, a method for forming a semiconductor structure is provided. The method includes forming a first dielectric layer on a semiconductor substrate, forming a first opening in the first dielectric layer, transferring the semiconductor substrate and the first dielectric layer into a deposition chamber, introducing a first precursor into the deposition chamber in a deposition process to form a first conductive structure in the first opening and on a surface of the first dielectric layer, introducing a first gas into the deposition chamber in a modification process to modify a surface property of the first conductive structure; and introducing a second precursor into the deposition chamber to form a second conductive structure in the first opening and on the surface of the first dielectric layer. The first precursor and the second precursor comprise the same metal, and the first gas is free of the metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a dielectric structure on a semiconductor substrate, wherein the dielectric structure has an opening exposing a top surface of the semiconductor substrate;
    introducing a first gas on the dielectric structure to form first conductive structures in direct contact with the dielectric structure and the top surface of the semiconductor substrate;
    introducing a second gas on the first conductive structures and the dielectric structure, wherein the second gas is different from the first gas;
    purging the dielectric structure with a purging gas after the introduction of the second gas and before the introduction of the third gas, wherein the first conductive structures remain on a portion of a top surface of the dielectric structure, a portion of sidewalls of the dielectric structure and the top surface of the semiconductor substrate after the purging; and
    introducing a third gas on the first conductive structures and the dielectric structure to form second conductive structures on the dielectric structure, wherein the first gas and the third gas comprise a same metal, and wherein after the purging and before forming the second conductive structures, a portion of the sidewalls of the dielectric structure in the opening and a portion of the top surface of the dielectric structure are exposed.

2. The method for forming a semiconductor structure as claimed in claim 1, wherein the metal is ruthenium (Ru), iridium (Ir), rhodium (Rh), molybdenum (Mo), nickel (Ni), or platinum (Pt).

3. The method for forming a semiconductor structure as claimed in claim 1, wherein the second gas comprises CO, $NH_3$, $O_2$, $N_2O$, NO, $H_2$, $N_2$, or a combination thereof.

4. The method for forming a semiconductor structure as claimed in claim 1, wherein the second gas does not comprise the metal.

5. The method for forming a semiconductor structure as claimed in claim 1, wherein the first gas comprises $Ru_3(CO)_{12}$, $Ru(CO)_5$, $C_{10}H_{10}Ru$, $Ru(CO)_3C_6H_8$, $Ru(CO)_2(tmhd)_2$, $Ru(CO)_2(acac)_2$, $Ru(C_6H_6)(C_6H_8)$, $Ru(acac)_3$, $RuO_4$, $Ru(EtCp)_2$, RuCpPy, Ru Carbonyl diketone derivatives, Ru cyclopentadienyl derivatives, $IrF_6$, Ir(CH₃COCHCOCH3)₃, Rh(CH₃COCHCOCH₃)₃, Rh(CO)₄, Rh(C₅H₄F₃O₂)₃, MoCl₆, MoF₆, Mo(CO)₆, Ni(CO)₄, Ni(C₅H₅)₂, Ni(C₅HF₆O₂)₂, Pt(CO)₂Cl₂, or a combination thereof.

6. The method for forming a semiconductor structure as claimed in claim 1,
wherein the purging gas comprises N₂, Ar, He, or a combination thereof.

7. The method for forming a semiconductor structure as claimed in claim 1, wherein after forming the first conductive structures and before forming the second conductive structures, a portion of a top surface of the dielectric structure is exposed.

8. The method for forming a semiconductor structure as claimed in claim 7, the portion of the top surface of the dielectric structure is covered by the second conductive structures.

9. A method for forming a semiconductor structure, comprising:
forming a dielectric layer on a semiconductor substrate;
etching the dielectric layer to form a trench in the dielectric layer, wherein the trench is defined by sidewalls of the dielectric layer and a top surface of the semiconductor substrate;
introducing a first precursor into the trench to form first conductive structures in direct contact with the sidewalls of the dielectric layer and the top surface of the semiconductor substrate, wherein the first conductive structures are made of Ru, and the first precursor comprises Ru₃(CO)₁₂, Ru(CO)₅, C₁₀H₁₀Ru, Ru(CO)₃C₆H₈, Ru(CO)₂(tmhd)₂, Ru(CO)₂(acac)₂, Ru(C₆H₆)(C₆H₈), Ru(acac)₃, RuO₄, Ru(EtCp)₂, RuCpPy, Ru Carbonyl diketone derivatives, Ru cyclopentadienyl derivatives, or a combination thereof;
introducing a first gas into the trench, wherein a first portion of the first gas is absorbed on surfaces of the first conductive structures, and a second portion of the first gas is absorbed on sidewalls of the dielectric layer;
introducing a purging gas into the trench to remove the second portion of the first gas absorbed on sidewalls of the dielectric layer, wherein after introducing the purging gas, a first portion of the first conductive structures remain on a top surface of the dielectric layer, and a second portion of the first conductive structures remain on the sidewalls of the dielectric layer, wherein the first portion of the first conductive structures are separated from each other, and the second portion of the first conductive structures are separated from each other; and
introducing a second precursor into the trench to form second conductive structures on the sidewalls of the dielectric layer, wherein the second conductive structures are made of Ru, and the second precursor comprises Ru₃(CO)₁₂, Ru(CO)₅, C₁₀H₁₀Ru, Ru(CO)₃C₆H₈, Ru(CO)₂(tmhd)₂, Ru(CO)₂(acac)₂, Ru(C₆H₆)(C₆H₈), Ru(acac)₃, RuO₄, Ru(EtCp)₂, RuCpPy, Ru Carbonyl diketone derivatives, Ru cyclopentadienyl derivatives, or a combination thereof, wherein the first conductive structures and the second conductive structures are in direct contact with the dielectric layer in the trench.

10. The method for forming a semiconductor structure as claimed in claim 9, wherein the first portion of the first gas is chemically absorbed on surfaces of the first conductive structures, and the second portion of the first gas is physically absorbed on sidewalls of the dielectric layer.

11. The method for forming a semiconductor structure as claimed in claim 10, wherein the first gas comprises CO, NH₃, O₂, N₂O, NO, H₂, N₂, or a combination thereof.

12. The method for forming a semiconductor structure as claimed in claim 11, before the introduction of the second precursor and after introducing the purging gas,
the first portion of the first gas remains absorbed on the surfaces of the first conductive structures.

13. A method for forming a semiconductor structure, comprising:
forming a first dielectric layer on a semiconductor substrate;
etching the first dielectric layer to form a first opening in the first dielectric layer;
transferring the semiconductor substrate and the first dielectric layer into a deposition chamber;
introducing a first precursor into the deposition chamber in a deposition process to form first conductive structures made of Ru in the first opening and on a surface of the first dielectric layer;
introducing a first gas into the deposition chamber in a modification process to modify a surface property of the first conductive structures; and
introducing a second precursor into the deposition chamber to form second conductive structures made of Ru in the first opening and on the surface of the first dielectric layer, wherein the first precursor and the second precursor comprise a same metal, and the first gas is free of the metal, and wherein the first conductive structures and the second conductive structures are in direct contact with the first dielectric layer in the first opening, and wherein one of the second conductive structures is formed between and in direct contact with two adjacent first conductive structures, and another one of the second conductive structures is formed on the first conductive structure and suspended on a sidewall of the first dielectric layer.

14. The method for forming a semiconductor structure as claimed in claim 13, wherein the metal is Ru, and the first precursor is introduced into the deposition chamber at a flow rate in a range from about 10 sccm to about 500 sccm for a duration in a range from about 1 second to about 60 seconds, and a pressure inside the deposition chamber during the introduction of the first precursor is in a range from about 0.0001 torr to about 0.01 torr.

15. The method for forming a semiconductor structure as claimed in claim 14, wherein the first precursor comprises Ru₃(CO)₁₂, Ru(CO)₅, C₁₀H₁₀Ru, Ru(CO)₃C₆H₈, Ru(CO)₂(tmhd)₂, Ru(CO)₂(acac)₂, Ru(C₆H₆)(C₆H₈), Ru(acac)₃, RuO₄, Ru(EtCp)₂, RuCpPy, Ru Carbonyl diketone derivatives, Ru cyclopentadienyl derivatives, or a combination thereof.

16. The method for forming a semiconductor structure as claimed in claim 13, further comprising:
forming a fin structure on the semiconductor substrate;
forming a source/drain structure on the fin structure;
forming a gate stack across the fin structure; and
repeating the deposition process and the modification process to form a source/drain contact structure in the first opening, wherein the source/drain contact structure comprises the first conductive structure and the second conductive structure and is in direct contact with the source/drain structure.

17. The method for forming a semiconductor structure as claimed in claim 13, further comprising:
  forming a fin structure on the semiconductor substrate;
  forming a source/drain structure on the fin structure;
  forming a second dielectric layer on the fin structure and covering the source/drain structure;
  forming a gate stack across the fin structure;
  removing a portion of the second dielectric layer to form a second opening exposing the source/drain structure;
  filling the second opening with a conductive material to form a source/drain contact structure in the second opening; and
  repeating the deposition process and the modification process to form a conductive via structure in the first opening, wherein the second dielectric layer is between the semiconductor substrate and the first dielectric layer, and the conductive via structure comprises the first conductive structure and the second conductive structure and is electrically connected to the source/drain contact structure.

18. The method for forming a semiconductor structure as claimed in claim 13, wherein the first opening exposes a top surface of the semiconductor substrate, and the first conductive structures are in direct contact with the first dielectric layer and the top surface of the semiconductor substrate.

19. The method for forming a semiconductor structure as claimed in claim 13, wherein sidewalls of the first dielectric layer in the first opening is filled with the first conductive structures and the second conductive structures without being exposed after forming the second conductive structures.

20. The method for forming a semiconductor structure as claimed in claim 13, wherein a portion of the first conductive structures and a portion of the second conductive structures are on a top surface of the first dielectric layer, and the portion of the first conductive structures are in direct contact with the portion of the second conductive structures.

* * * * *